US012701868B2

(12) United States Patent
Aoki et al.

(10) Patent No.: US 12,701,868 B2
(45) Date of Patent: Aug. 4, 2026

(54) DISPLAY DEVICE

(71) Applicant: Japan Display Inc., Tokyo (JP)

(72) Inventors: Hayata Aoki, Tokyo (JP); Jun Nitta, Tokyo (JP); Marina Mochizuki, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 369 days.

(21) Appl. No.: 18/437,263

(22) Filed: Feb. 9, 2024

(65) Prior Publication Data

US 2024/0276784 A1     Aug. 15, 2024

(30) Foreign Application Priority Data

Feb. 13, 2023     (JP) ................................. 2023-019930

(51) Int. Cl.
   *H10K 59/122*     (2023.01)
   *H10K 59/124*     (2023.01)
   *H10K 59/126*     (2023.01)
   *H10K 59/80*      (2023.01)

(52) U.S. Cl.
   CPC ......... *H10K 59/122* (2023.02); *H10K 59/124* (2023.02); *H10K 59/126* (2023.02); *H10K 59/871* (2023.02); *H10K 59/8723* (2023.02)

(58) Field of Classification Search
CPC ... H10K 59/122; H10K 59/124; H10K 59/126
See application file for complete search history.

(56) References Cited

U.S. PATENT DOCUMENTS

2014/0001452 A1     1/2014   Shiobara et al.

FOREIGN PATENT DOCUMENTS

JP      2014-011083 A    1/2014
WO    2022/144666 A1   7/2022

*Primary Examiner* — Scott B Geyer
(74) *Attorney, Agent, or Firm* — XSENSUS LLP

(57) ABSTRACT

According to one embodiment, a display device includes a plurality of pixels including a first pixel, a second pixel and a third pixel, each of the plurality of pixels include, an anode, an organic EL layer provided on the anode, at least one set of sidewall pairs provided to cover a side surface of the organic EL layer and a cathode provided in an opening portion of the bank and in contact with the organic EL layer. The at least one set of side wall pairs includes a first sidewall formed of aluminum oxide and a second sidewall formed of silicon nitride. The first pixel includes at least two sets of the side wall pairs, and the second pixel includes at least one set of the sidewall pair.

4 Claims, 27 Drawing Sheets

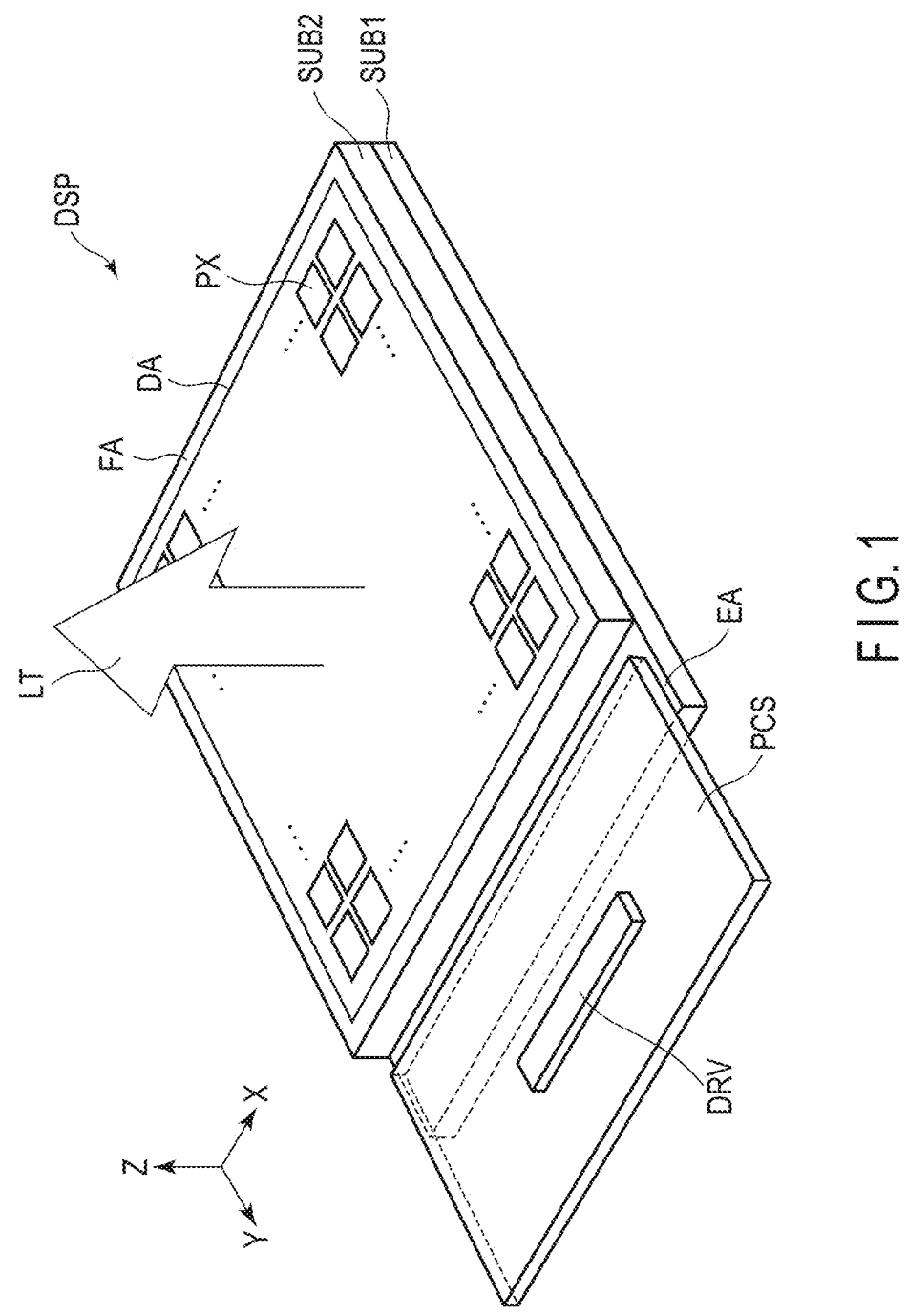
F I G. 1

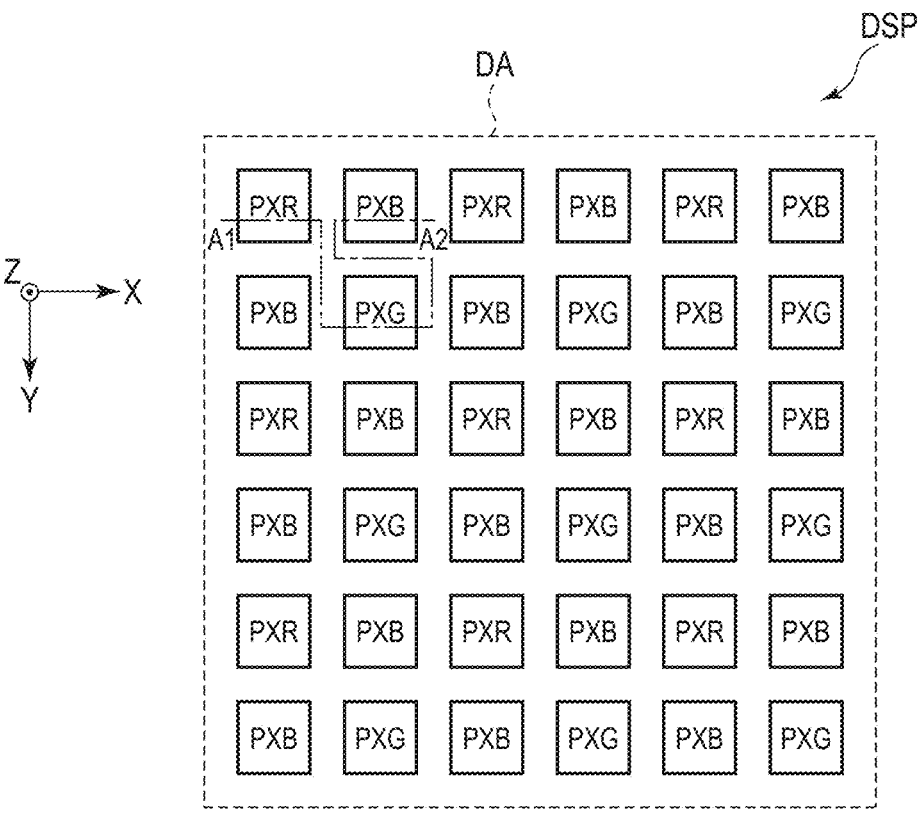
F I G. 2

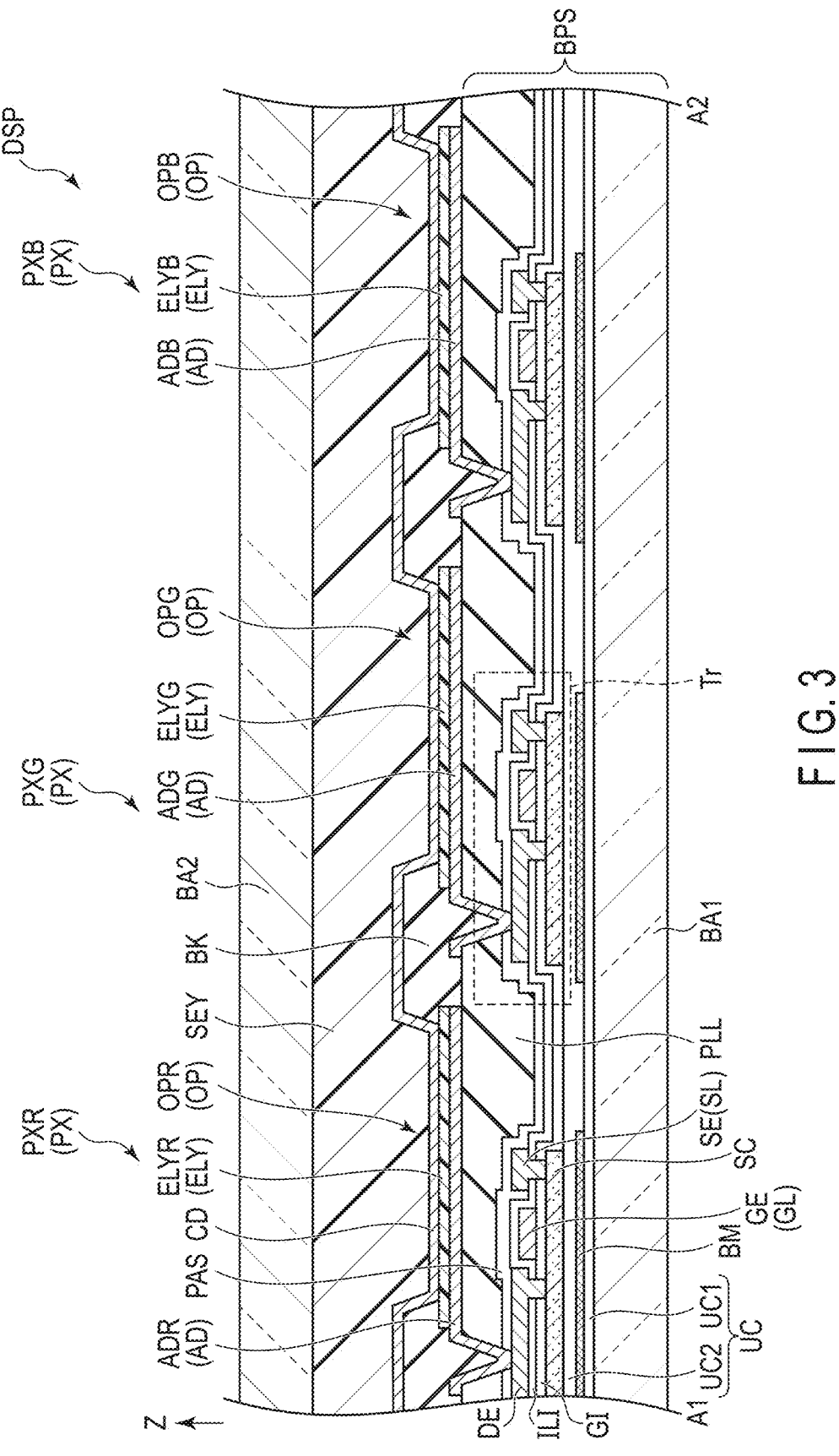
F I G . 3

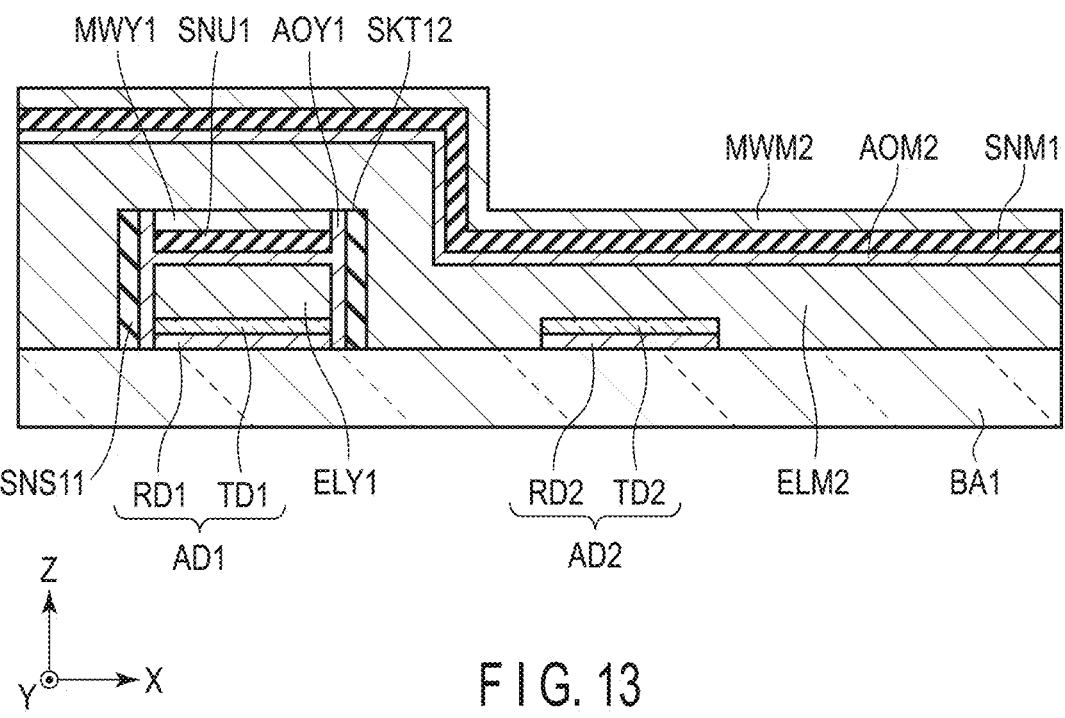
F I G. 13
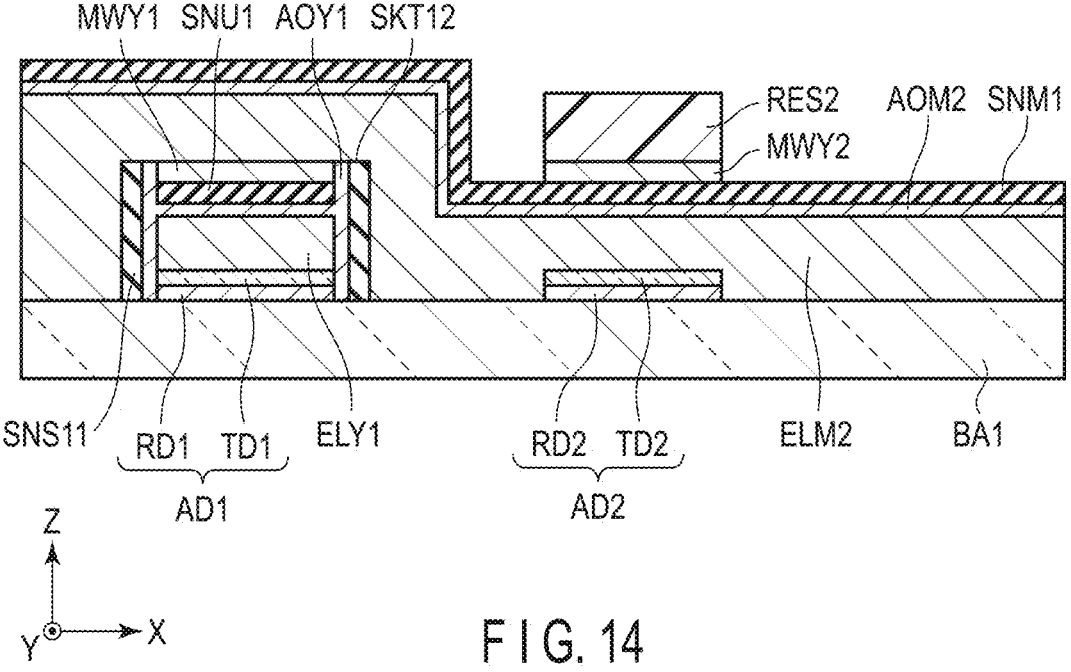
F I G. 14

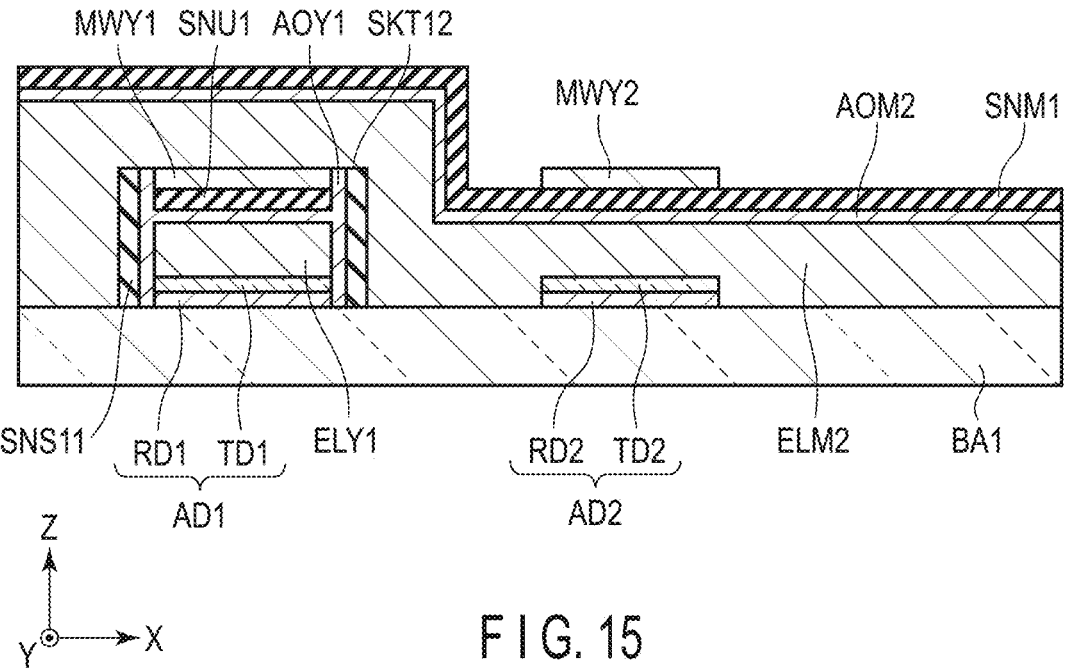
F I G. 15
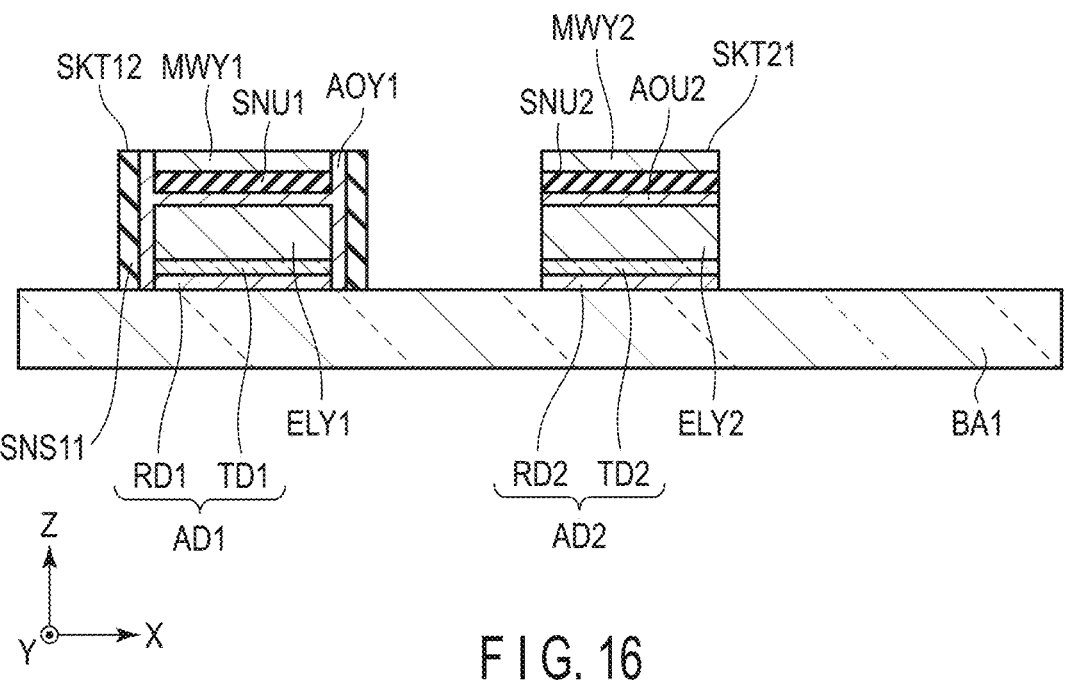
F I G. 16

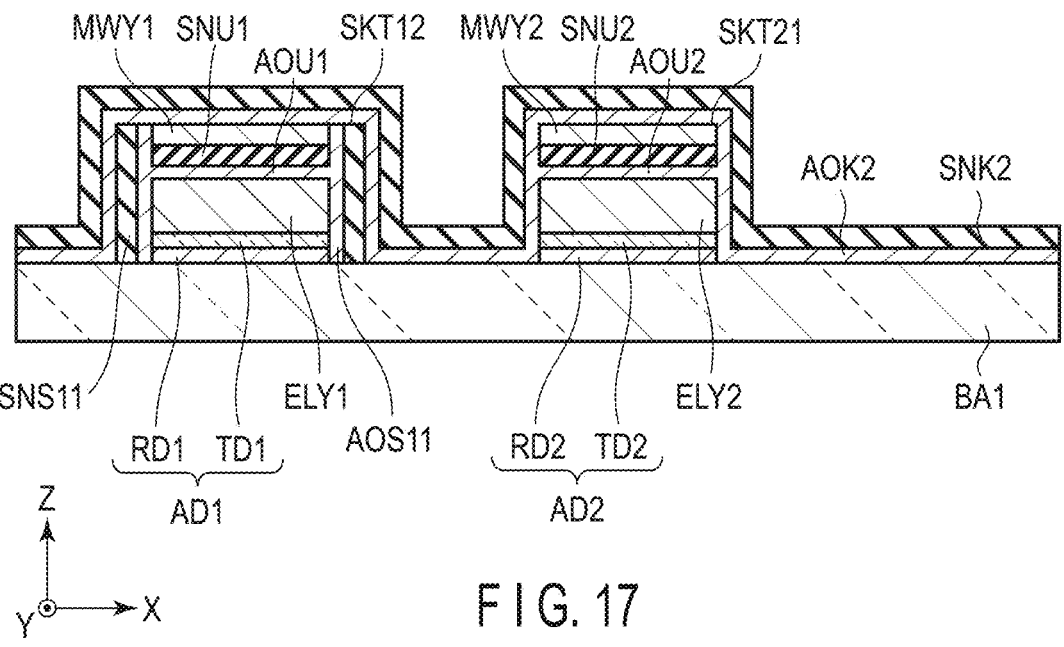
F I G. 17
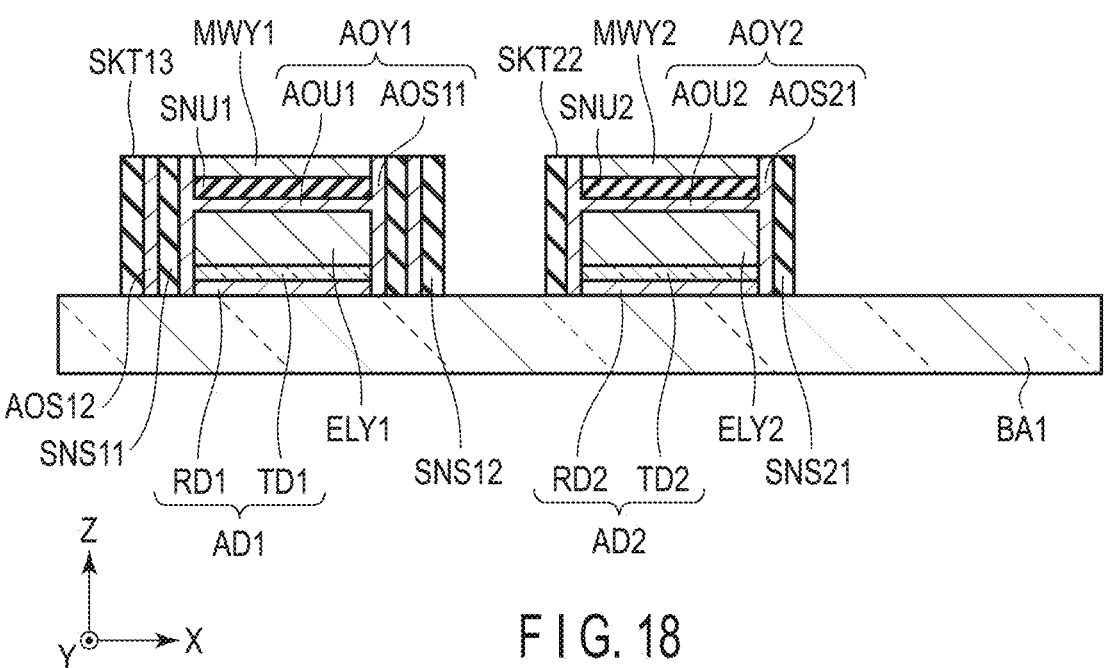
F I G. 18

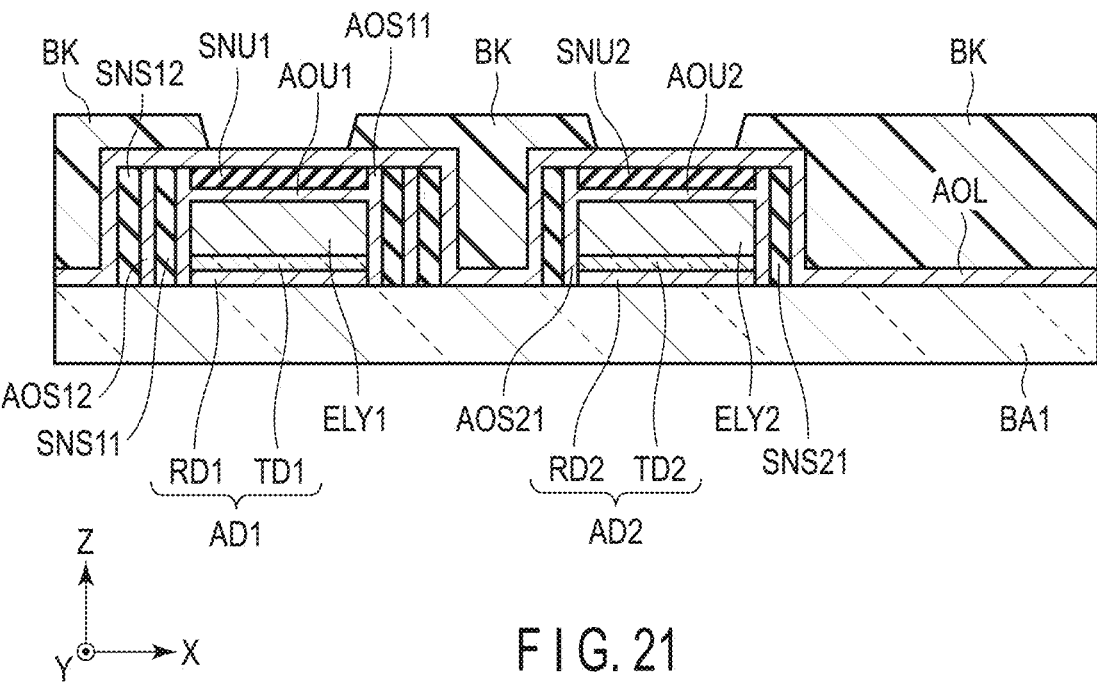
F I G. 21
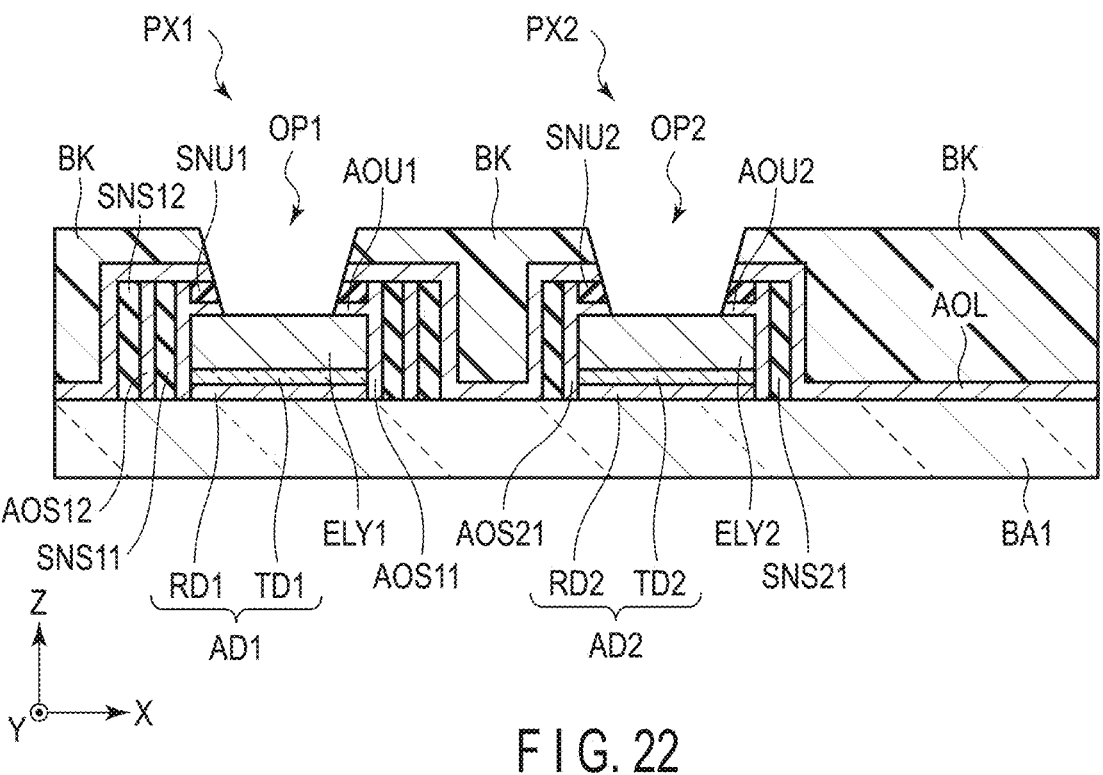
F I G. 22

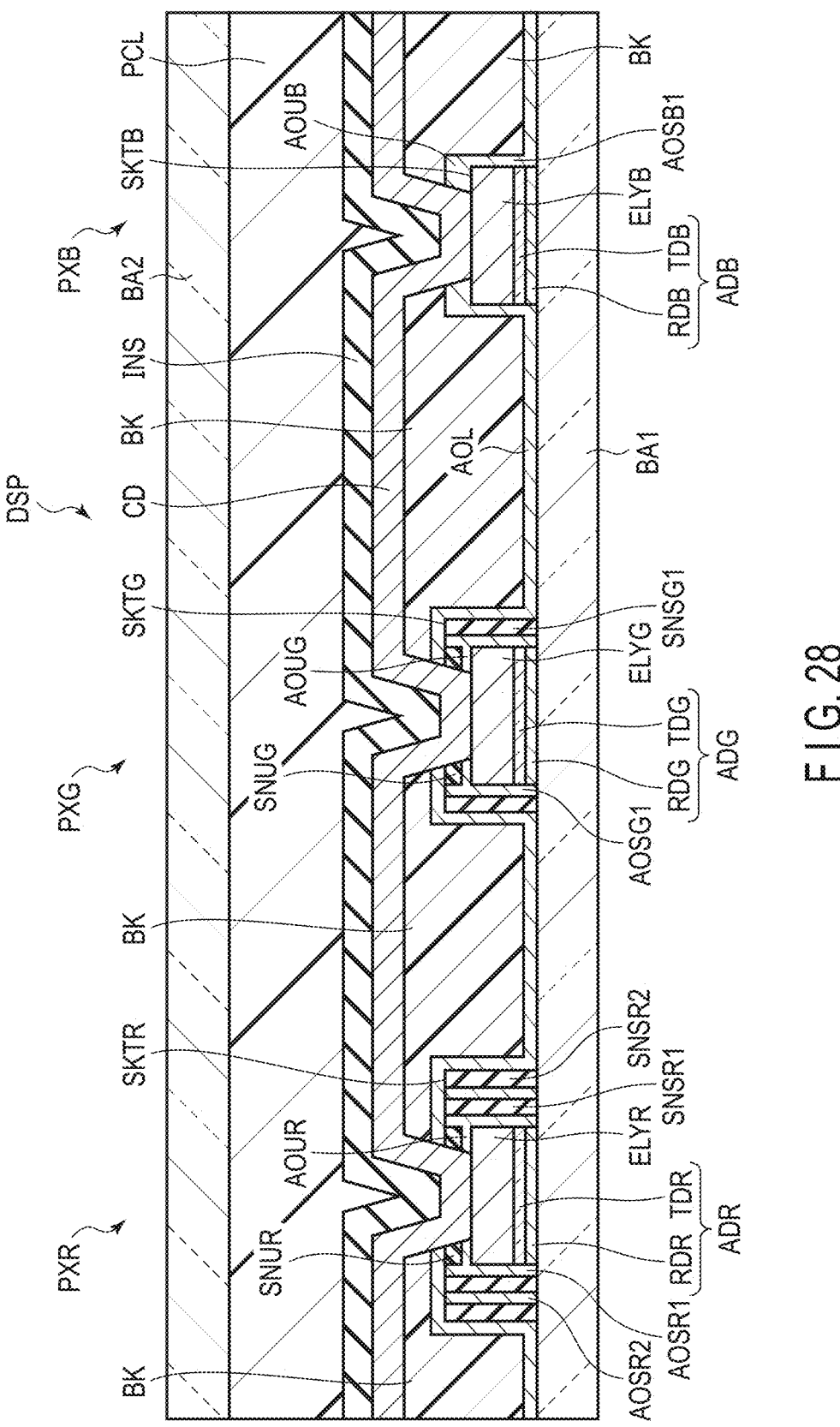
F I G. 28

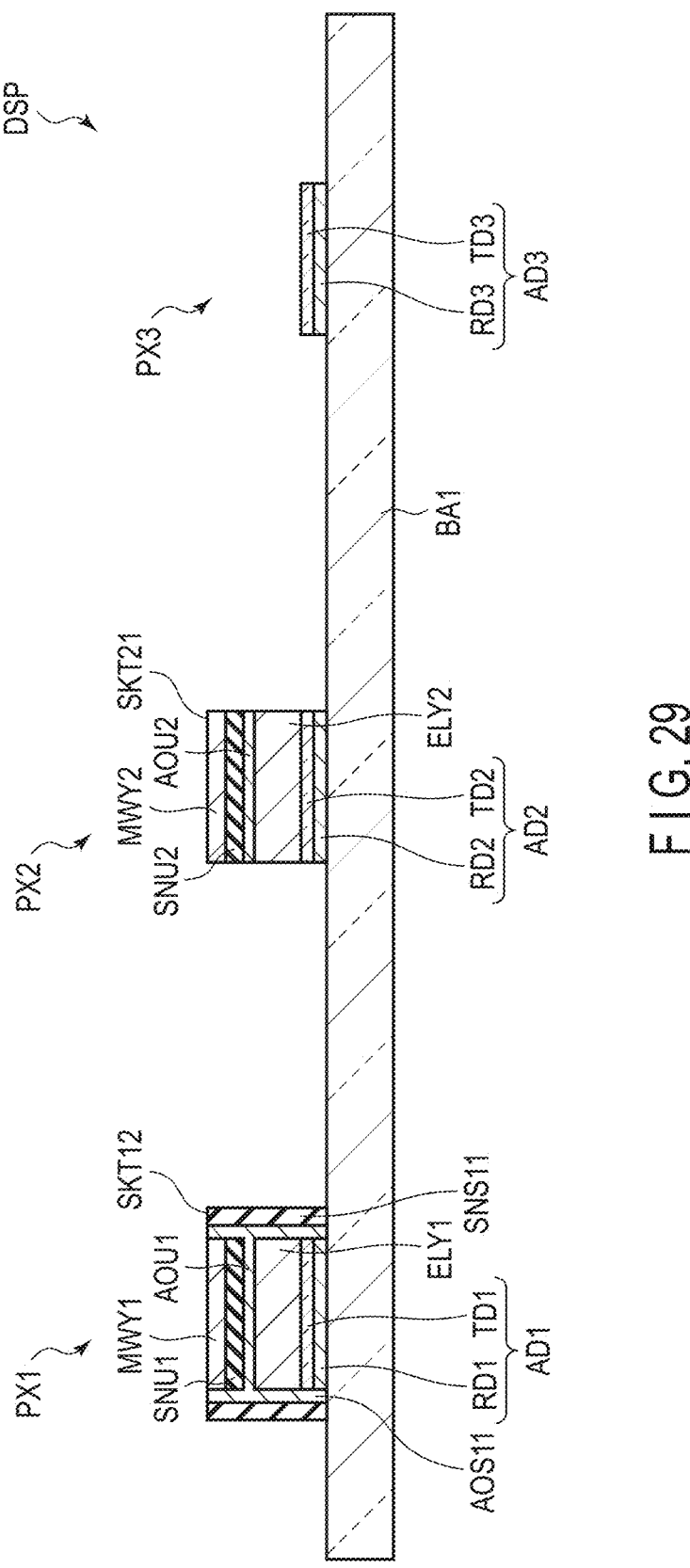
F I G. 29

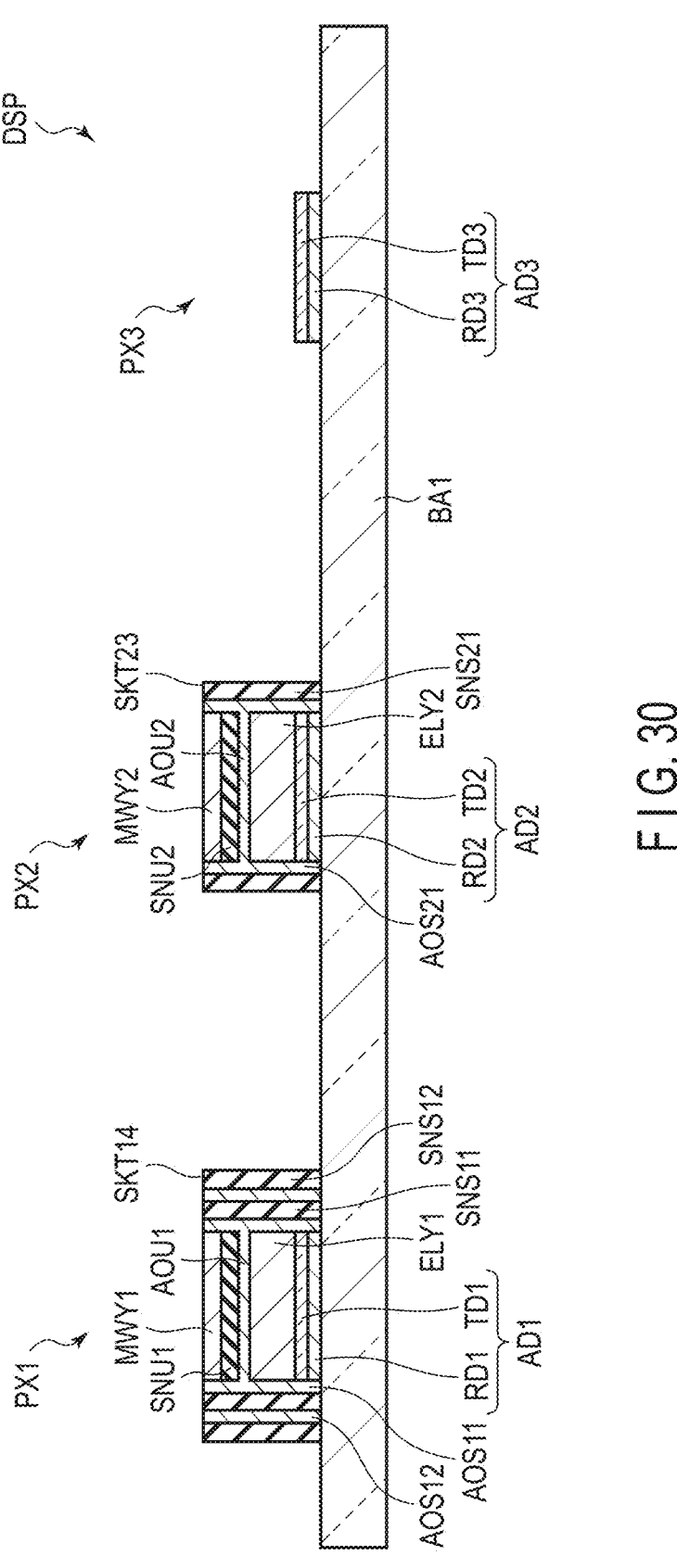
F I G. 30

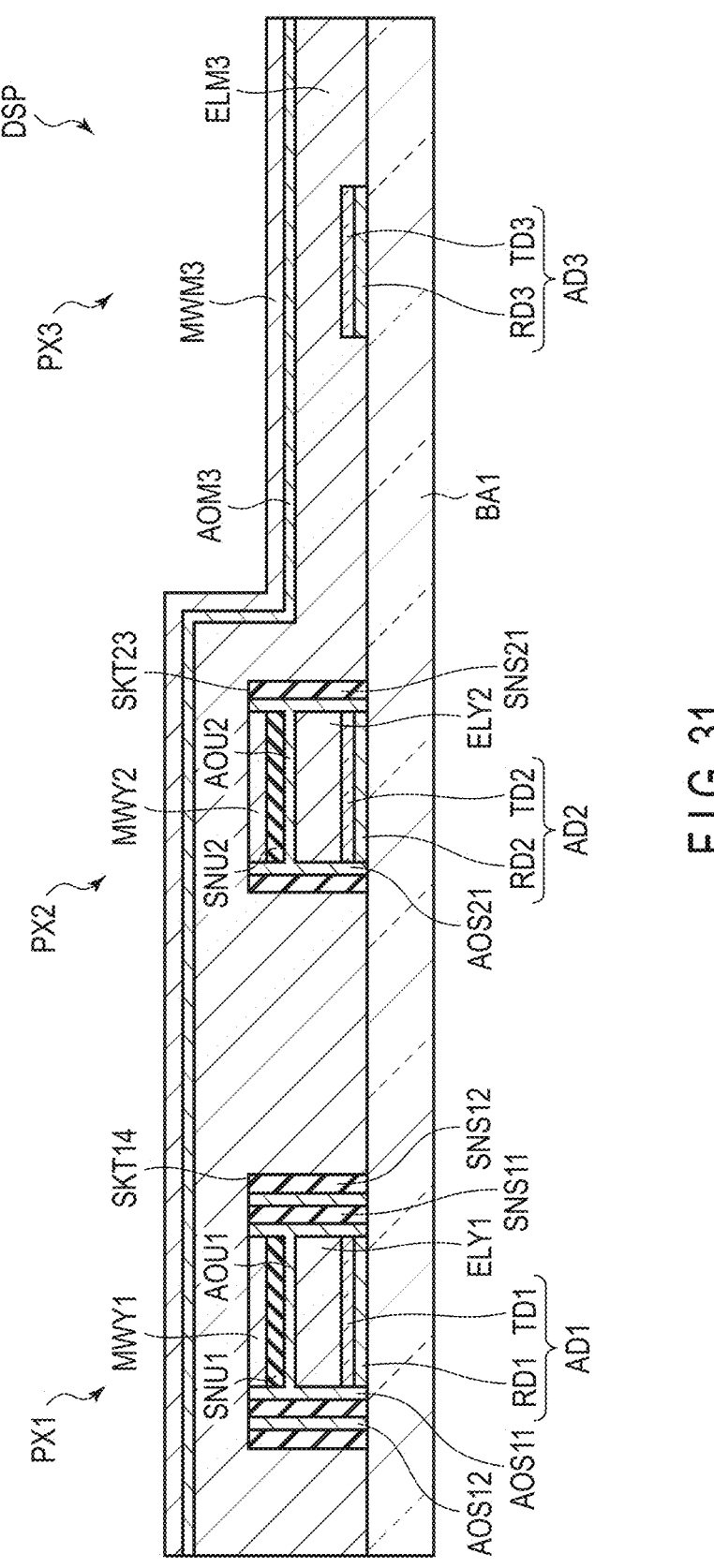
F I G. 31

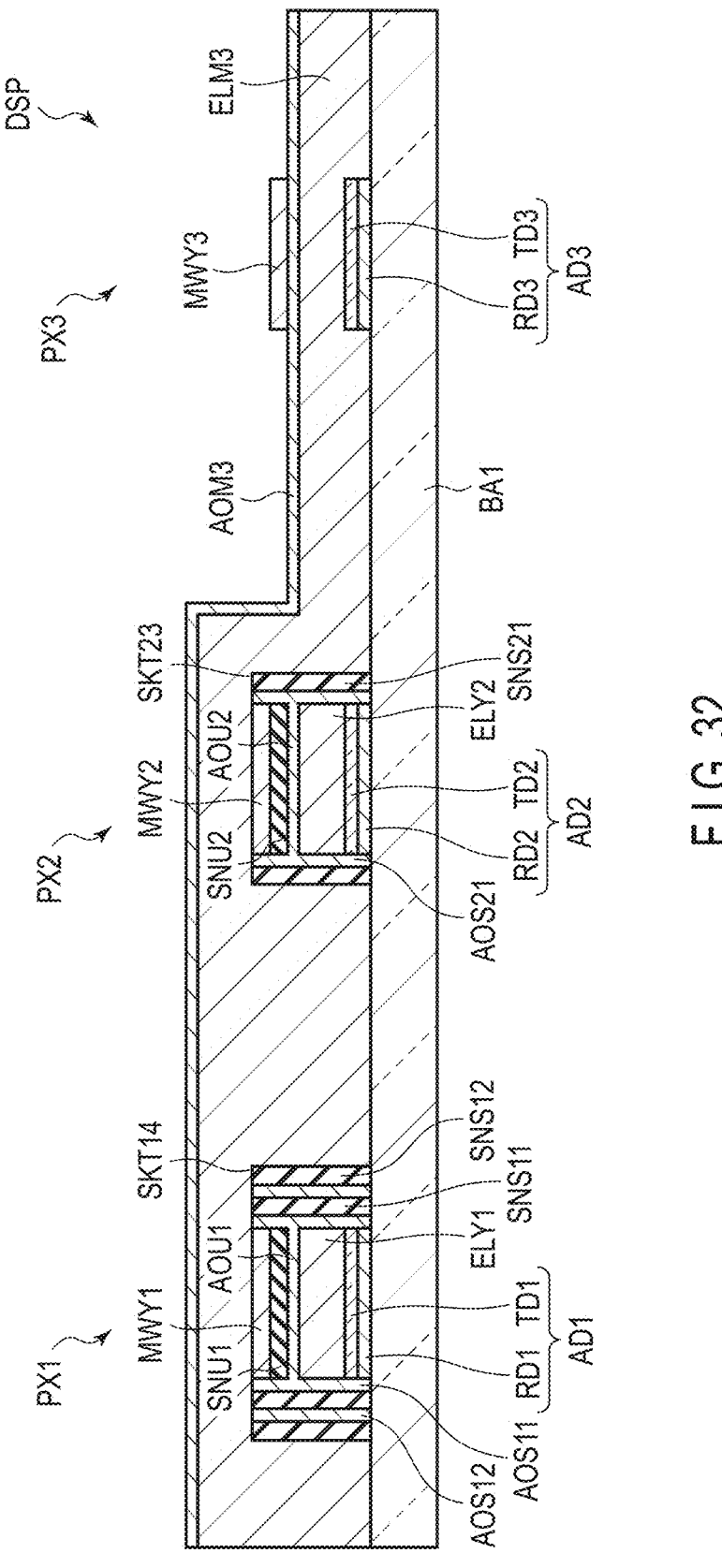
F I G. 32

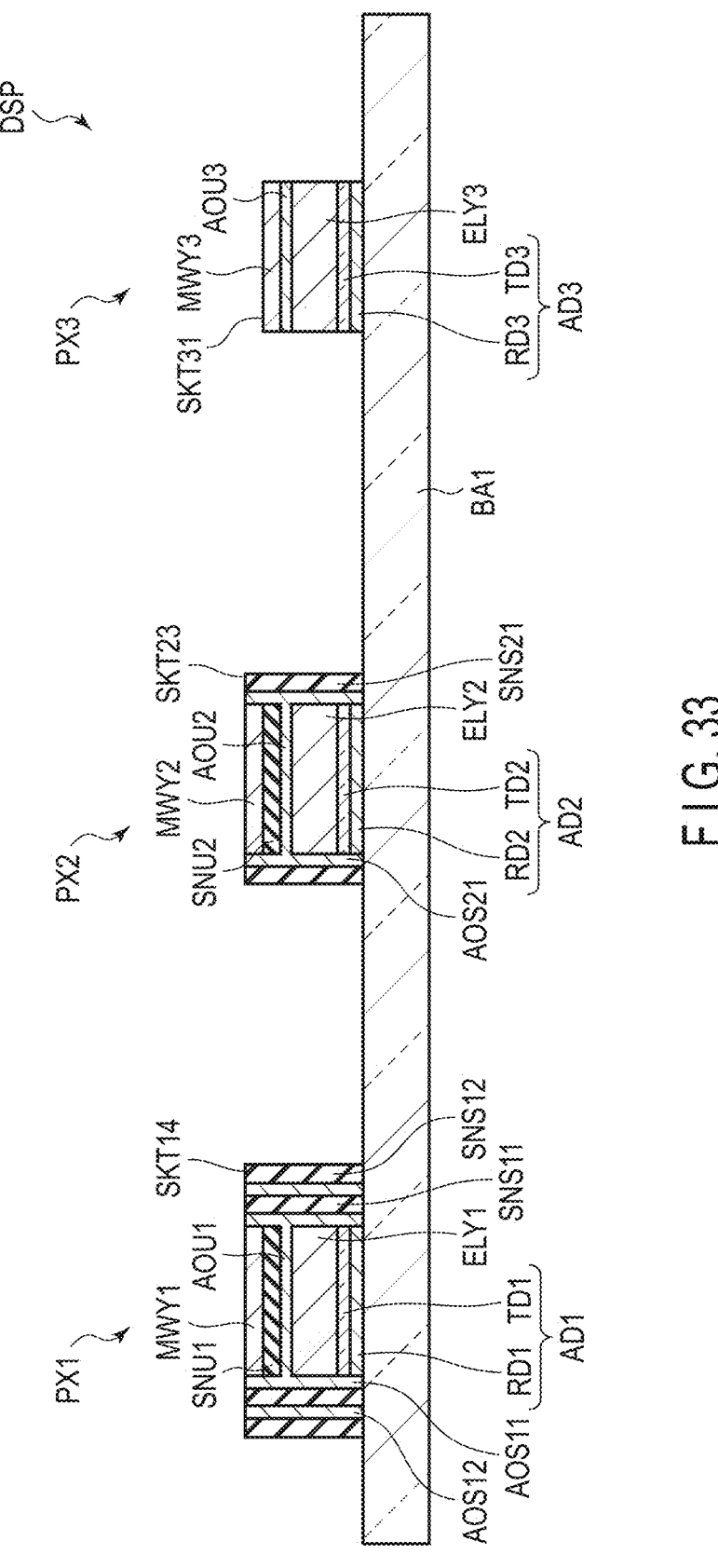
F I G. 33

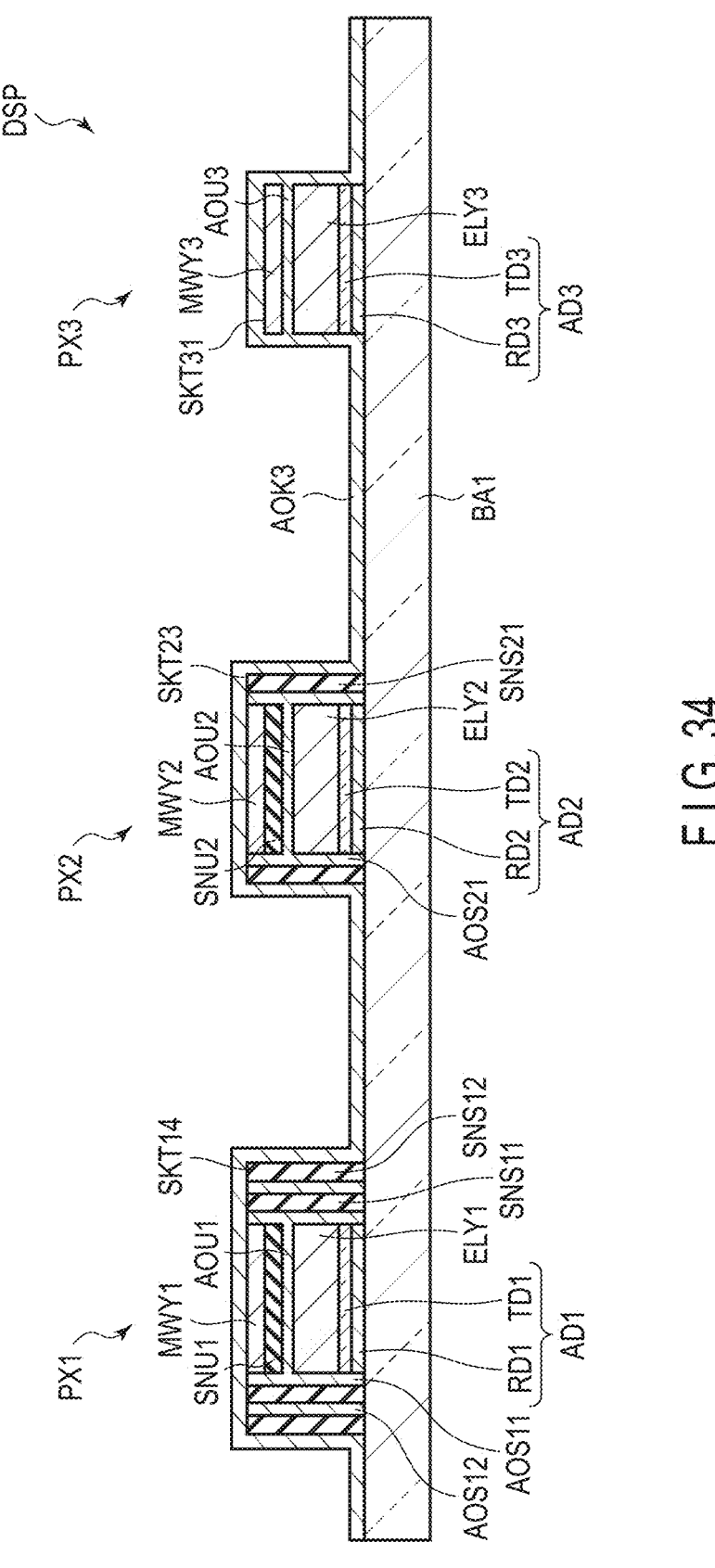
F I G. 34

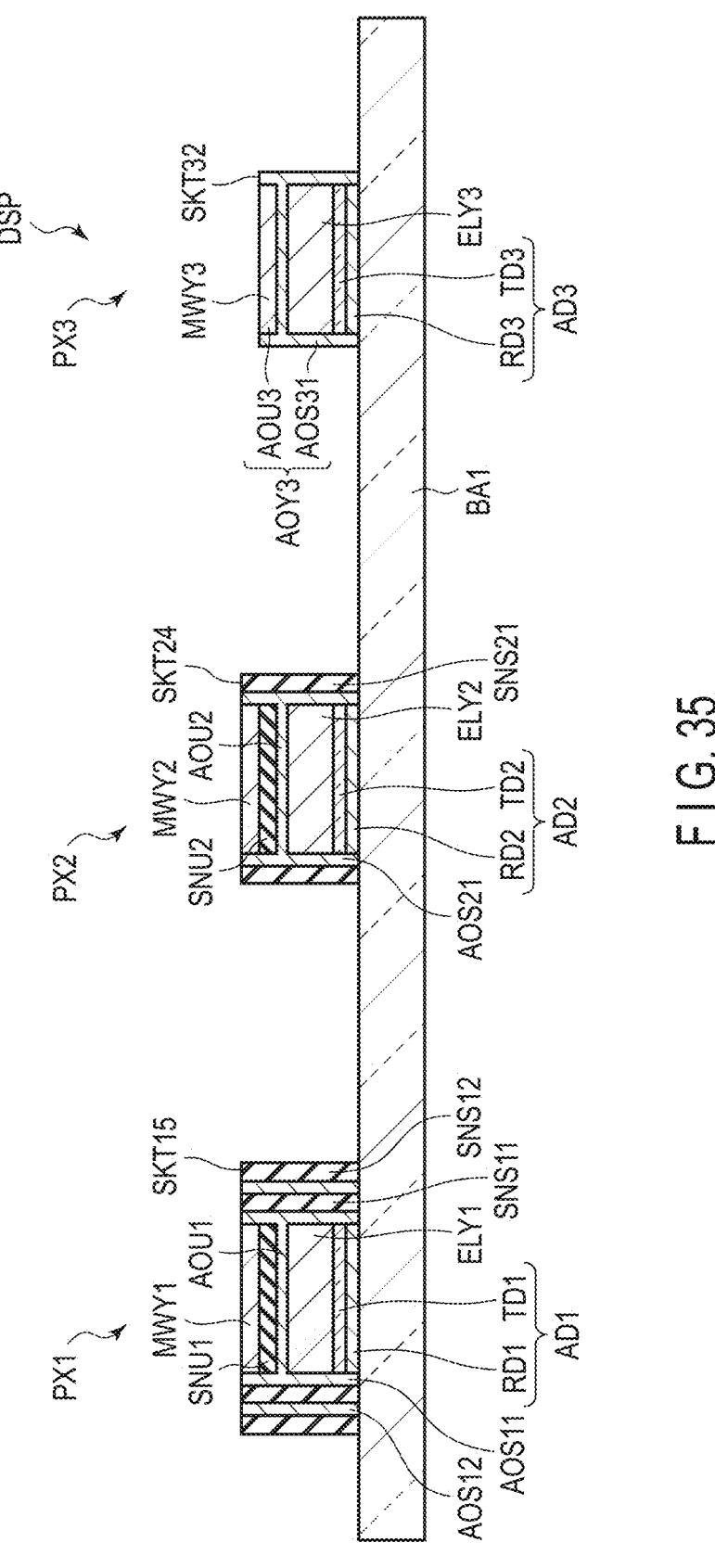
F I G. 35

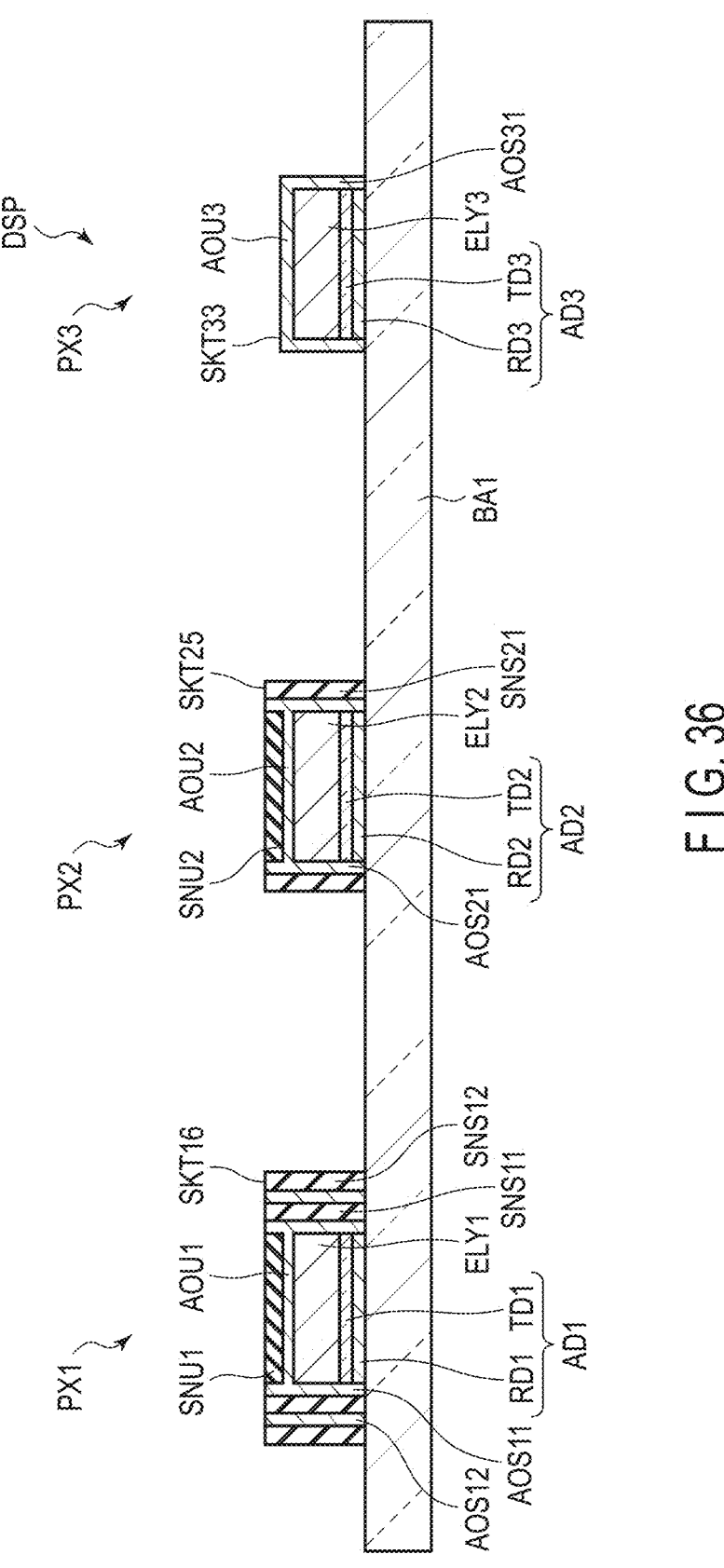
F I G. 36

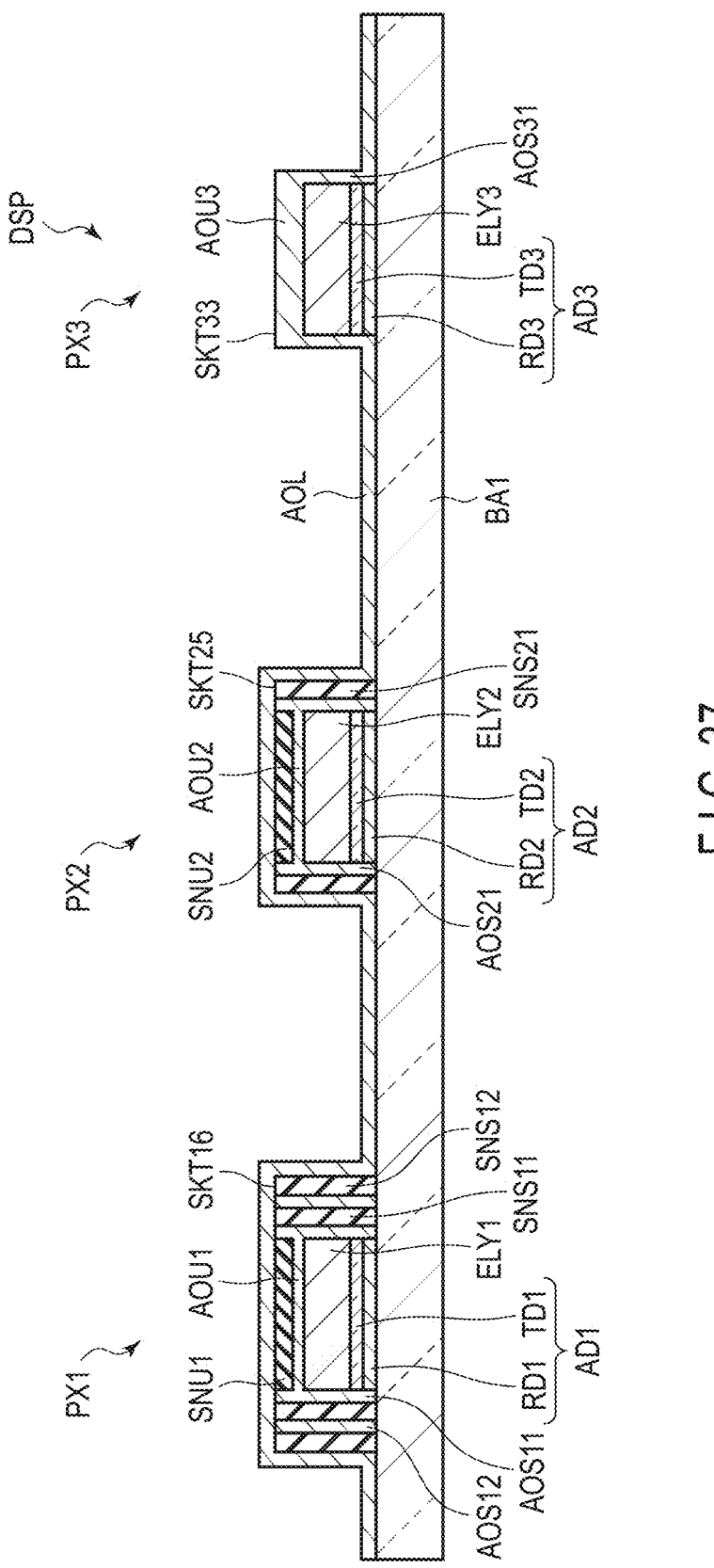
F I G. 37

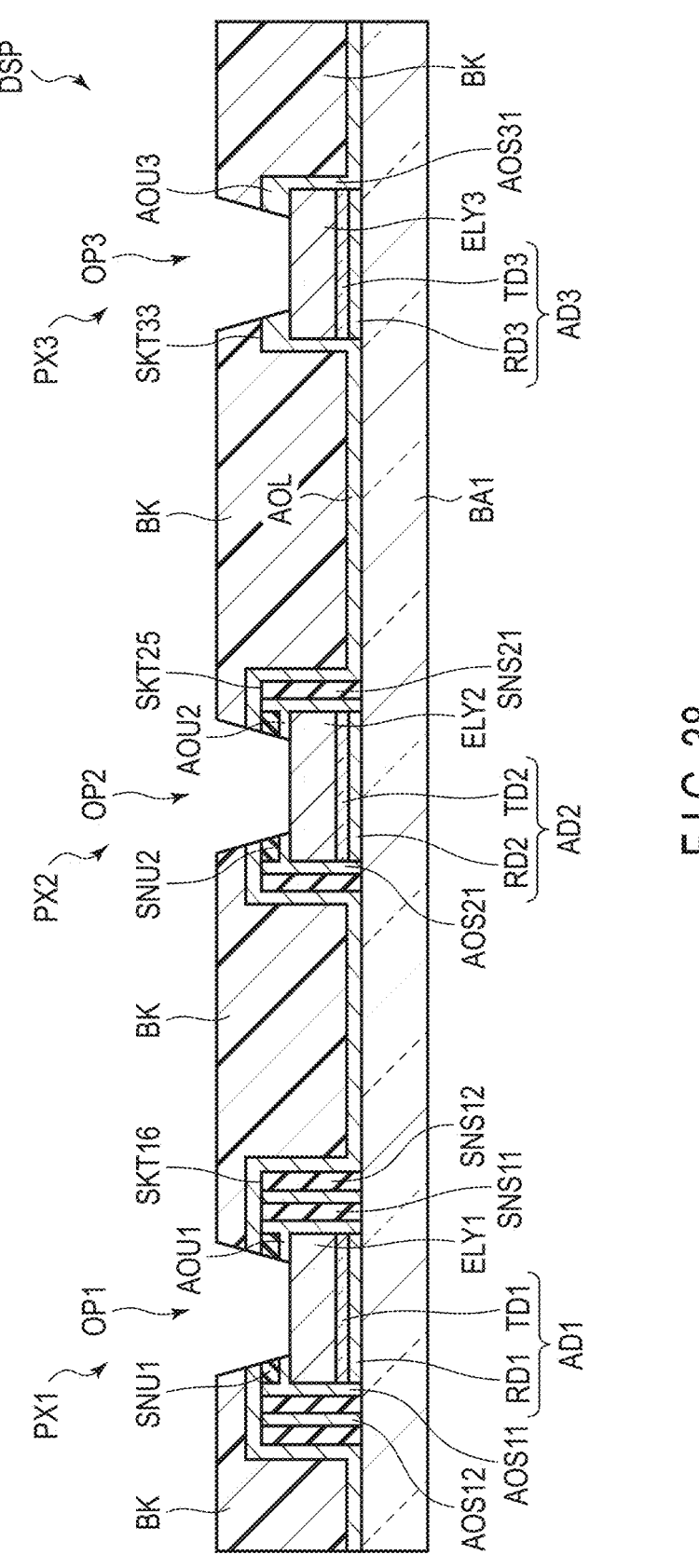
F I G. 38

DISPLAY DEVICE

CROSS-REFERENCE TO RELATED APPLICATION

This application is based upon and claims the benefit of priority from Japanese Patent Application No. 2023-019930 filed Feb. 13, 2023, the entire contents of which are incorporated herein by reference.

FIELD

Embodiments described herein relate generally to a display device.

BACKGROUND

Organic electroluminescent (organic EL) display devices have been developed, which achieve light emission by utilizing energy at the time of recombination between holes injected from the anode and electrons injected from the cathode.

BRIEF DESCRIPTION OF THE DRAWINGS

FIG. 1 is an overall perspective view showing a display device of Embodiment 1.

FIG. 2 is a partial plan view schematically showing a configuration example of the display device.

FIG. 3 is a cross-sectional view of the display device taken along line A1-A2 shown in FIG. 2.

FIG. 13 is a cross-sectional view showing a further step in the method of manufacturing the display device of Embodiment 1.

FIG. 14 is a cross-sectional view showing a further step in the method of manufacturing the display device of Embodiment 1.

FIG. 15 is a cross-sectional view showing a further step in the method of manufacturing the display device of Embodiment 1.

FIG. 16 is a cross-sectional view showing a further step in the method of manufacturing the display device of Embodiment 1.

FIG. 17 is a cross-sectional view showing a further step in the method of manufacturing the display device of Embodiment 1.

FIG. 18 is a cross-sectional view showing a further step in the method of manufacturing the display device of Embodiment 1.

FIG. 21 is a cross-sectional view showing a further step in the method of manufacturing the display device of Embodiment 1.

FIG. 22 is a cross-sectional view showing a further step in the method of manufacturing the display device of Embodiment 1.

FIG. 28 is a cross-sectional view showing a further step in the method of manufacturing the display device of Embodiment 2.

FIG. 29 is a cross-sectional view showing a further step in the method of manufacturing the display device of Embodiment 2.

FIG. 30 is a cross-sectional view showing a further step in the method of manufacturing the display device of Embodiment 2.

FIG. 31 is a cross-sectional view showing a further step in the method of manufacturing the display device of Embodiment 2.

FIG. 32 is a cross-sectional view showing a further step in the method of manufacturing the display device of Embodiment 2.

FIG. 33 is a cross-sectional view showing a further step in the method of manufacturing the display device of Embodiment 2.

FIG. 34 is a cross-sectional view showing a further step in the method of manufacturing the display device of Embodiment 2.

FIG. 35 is a cross-sectional view showing a further step in the method of manufacturing the display device of Embodiment 2.

FIG. 36 is a cross-sectional view showing a further step in the method of manufacturing the display device of Embodiment 2.

FIG. 37 is a cross-sectional view showing a further step in the method of manufacturing the display device of Embodiment 2.

FIG. 38 is a cross-sectional view showing a further step in the method of manufacturing the display device of Embodiment 2.

DETAILED DESCRIPTION

Figure 4:
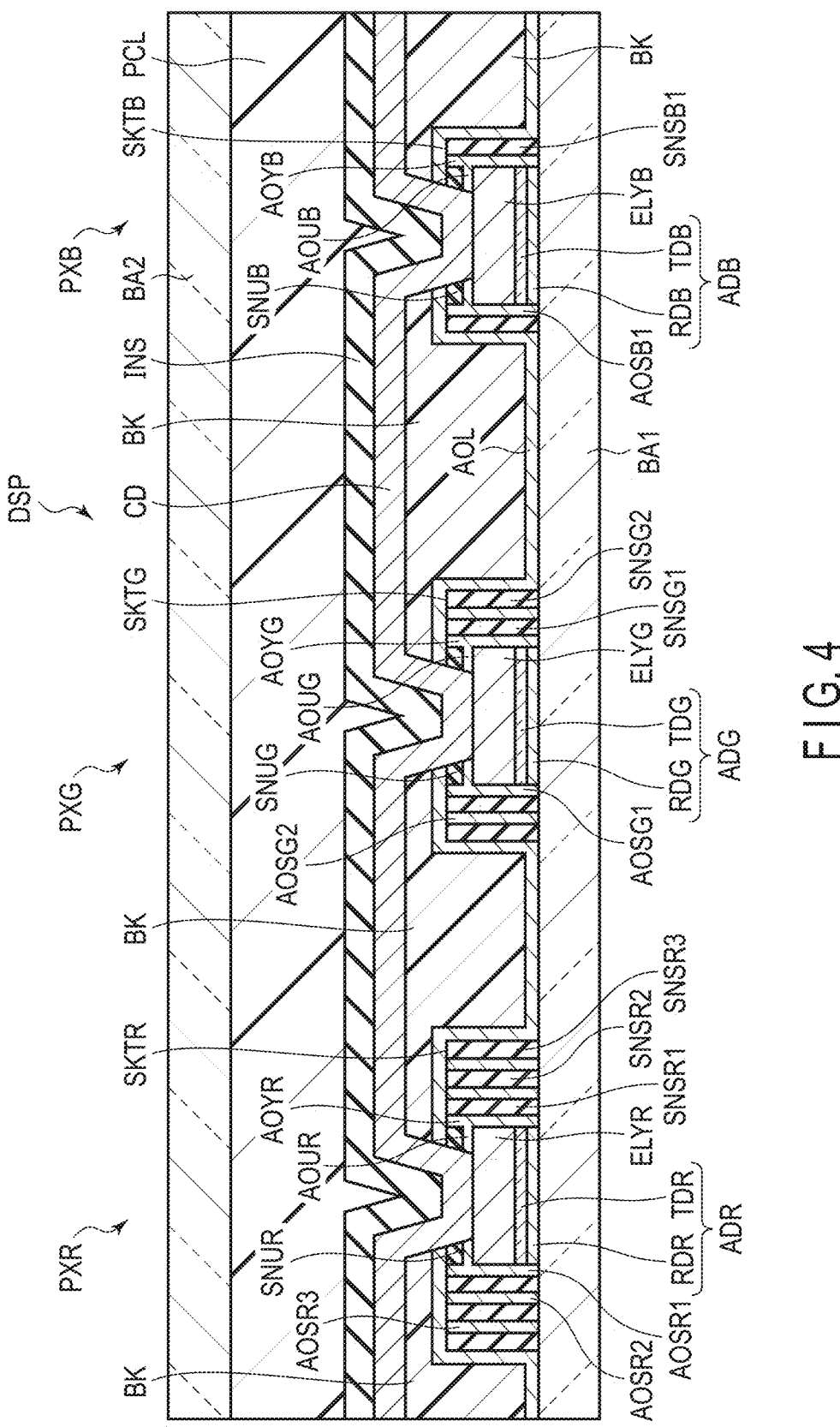
FIG. 4 is a cross-sectional view schematically showing a configuration example of the display device of Embodiment 1.

In general, according to one embodiment, a display device comprises:
  a plurality of pixels including a first pixel, a second pixel and a third pixel; and
  a bank provided between each respective adjacent pair of the pixels,
  each of the plurality of pixels comprising, on a base:
  an anode;
  an organic EL layer provided on the anode;
  at least one set of sidewall pairs provided to cover a side surface of the organic EL layer; and
  a cathode provided in an opening portion of the bank and in contact with the organic EL layer, and
  the at least one set of side wall pairs comprising:
  a first sidewall formed of aluminum oxide; and
  a second sidewall formed of silicon nitride, and
  the first pixel including at least two sets of the side wall pairs, and
  the second pixel including at least one set of the sidewall pair.

An object of this embodiment is to provide a display device with improved display quality.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a display device with reference to the drawings.

In this embodiment, a first direction X, a second direction Y and a third direction Z are orthogonal to each other, but may intersect at an angle other than 90 degrees. The direction toward the tip of the arrow in the third direction Z is defined as up or above, and the direction opposite to the direction toward the tip of the arrow in the third direction Z is defined as down or below. Note that the first direction X, the second direction Y and the third direction Z may as well be referred to as an X direction, a Y direction and a Z direction, respectively.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the optical control element on a tip side of the arrow in the third direction Z. Here, viewing from this observation position toward the X-Y plane defined by the first direction X and the second direction Y is referred to as plan view. Viewing a cross-section of the display device in the X-Z plane defined by the first direction X and the third direction Z or in the Y-Z plane defined by the second direction Y and the third direction Z is referred to as cross-sectional view.

Embodiment 1

FIG. 1 is an overall perspective view of a display device of Embodiment 1. A display device DSP comprises a display area DA and a peripheral area FA provided around the display area DA on a substrate SUB1. The display device DSP includes a plurality of pixels PX arranged in the display area DA. In the display device DSP, light LT from the rear surface is transmitted to the front surface and vice versa.

On an upper surface of the display area DA, a substrate SUB2 is provided as a sealing member. The substrate SUB2 is fixed to the substrate SUB1 by a seal material (not shown) provided to surround the display area DA. The display area DA formed on the substrate SUB1 is sealed so as not to be exposed to the atmosphere by the substrate SUB2 as a sealing member and the sealing material.

An area EA in an end portion of the substrate SUB1 is located outside of the substrate SUB2. In the area EA, a wiring circuit board PCS is provided. On the wiring circuit board PCS, a drive element DRV that outputs video signals and drive signals is provided. Signals from the drive element DRV are input to the pixels PX in the display area DA via the wiring circuit board PCS. Based on the video signals and various control signals, the pixels PX emits light.

FIG. 2 is a partial plan view schematically showing a configuration example of the display device. The plurality of pixels PX includes pixels PXR which emit red color, pixels PXG which emit green color and pixels PXB which emit blue color. Note that the pixels PXR, the pixels PXG and the pixels PXB may as well be referred to as first pixels, second pixels and third pixels, respectively. Each pixel PXR is disposed next to respective pixels PXB along the first direction X and the second direction Y. Each pixel PXG is disposed next to respective pixels PXB along the first direction X and the second direction Y. Each pixel PXB is disposed next to a respective pixel PXR along the first direction and next to a respective pixel PXG along the second direction Y.

FIG. 3 is a diagram showing a cross-sectional view of the display device taken along line A1-A2 shown in FIG. 2.

A base BA1 is, for example, glass or a base material made of a resin material. For example, acrylic, polyimide, polyethylene terephthalate, polyethylene naphthalate or the like may be used as the resin material, and may be formed from a single layer or a stacked body of multiple layers of any of these.

An insulating layer UC1 is provided on the base BA1. The insulating layer UC1 is formed from, for example, a single layer of a silicon oxide film or silicon nitride film or a stacked body of these layers.

On the insulating layer UC1, a light-shielding layer BM may as well be provided to overlap a transistor Tr. The light-shielding layer BM suppresses changes in transistor characteristics, which may be caused by light penetration or the like from the rear surface of the channel of the transistor Tr. When the light-shielding layer BM is formed of a conductive layer, it is also possible to impart a back-gate effect to the transistor Tr by providing a predetermined potential.

An insulating layer UC2 is provided to cover the insulating layer UC1 and the light-shielding layer BM. For the insulating layer UC2, a material similar to that of the insulating layer UC1 can be used. The insulating layer UC2 may as well be made of a material different from that of the insulating layer UC1. For example, silicon oxide can be used for the insulating layer UC1, whereas silicon nitride for the insulating layer UC2. The insulating layers UC1 and UC2 together may be referred to as insulating layer UC.

The transistor Tr is provided on the insulating layer UC. The transistor Tr includes a semiconductor layer SC, an insulating layer GI, a gate electrode GE (a scanning line), an insulating layer ILI, a source electrode SE (a signal line) and a drain electrode DE.

As the semiconductor layer SC, amorphous silicon, poly-silicon or an oxide semiconductor is used.

As the insulating layer GI, for example, silicon oxide or silicon nitride is provided in a single layer or in a stacked body of these layers.

For example, a molybdenum-tungsten alloy (MoW) is used as the gate electrode GE. The gate electrode GE may be formed to be integrated with the scanning line GL.

The insulating layer ILI is provided to cover the semiconductor layer SC and the gate electrode GE. The insulating layer ILI is formed, for example, by a single layer of a silicon oxide layer or silicon nitride layer or a stacked body of these layers.

On the insulating layer ILI, the source electrode SE and the drain electrode DE are provided. The source electrode SE and drain electrode DE are connected to the source region and drain region of the semiconductor layer SC, respectively, via contact holes made in the insulating layer ILI and the insulating layer GI. The source electrode SE may as well be formed to be integrated with the signal line.

An insulating layer PAS is provided to cover the source electrode SE, the drain electrode DE and the insulating layer ILI. Further, an insulating layer PLL is provided to cover the insulating layer PAS.

The insulating layer PAS is formed using an inorganic insulating material. The inorganic insulating material is, for example, a single layer of silicon oxide or silicon nitride or a stacked body of these. The insulating layer PLL is formed using an organic insulating material. The organic insulating material is, for example, an organic material such as pho-tosensitive acrylic, polyimide or the like. With the insulating layer PLL thus provided, steps caused by the transistor Tr can be planarized.

On the insulating layer PLL, an anode AD is provided. The anode AD is connected to the drain electrode DE via contact holes made in the insulating layers PAS and PLL. Note that the anode provided in each pixel PXR is referred to as an anode ADR, the anode provided in each pixel PXB is referred to as an anode ADB, and the anode provided in each pixel PXG is referred to as an anode ADG. When it is not necessary to distinguish the anode ADR, the anode ADG and the anode ADB from each other, they are simply referred to as anodes AD.

The anodes AD, for example, should be formed from a stacked body of a reflective electrode and a transparent electrode. The reflective electrode is formed of a conductive material having high reflectivity, that is, for example, silver (Ag) or molybdenum-tungsten alloy (MoW). The transparent electrode is formed of indium tin oxide (ITO) or indium zinc oxide (IZO), for example.

In this embodiment, the configuration from the base BA1 to the insulating layer PLL is referred to as a backplane BPS.

A bank BK (which may as well be referred to as a projecting portion or rib) is provided between each adjacent pair of anodes AD. As the material of the bank BK, an organic material similar to the material of the insulating layer PLL is used. The bank BK is opened to expose a part of the respective anode AD.

An aperture made in each pixel PXR is referred to as an aperture OPR, an aperture made in each pixel PXB is referred to as an aperture OPB, and an aperture made in each pixel PXG is referred to as an aperture OPG. When it is not necessary to distinguish the aperture OPR, the aperture OPB and the aperture OPG from each other, they are simply referred to as apertures OP.

It is preferable that an end portion of each aperture OP should be gently tapered in cross-sectional view. If the end portion of the aperture OP has a steep shape, coverage defects will occur in an organic EL layer ELY that is to be formed later.

The organic EL layer ELY is provided between each adjacent pair of banks BK so as to overlap the respective anode AD. Although the details thereof will be provided later, note that the organic EL layer ELY includes a hole injection layer HIL, a hole transport layer HTL, a light emitting layer EML, an electron transport layer ETY and an electron injection layer EIL. The organic EL layer ELY may further include an electron blocking layer and a hole block-ing layer, if necessary.

The organic EL layer provided on each pixel PXR is referred to as an organic EL layer ELYR, the organic EL layer provided on each pixel PXB is referred to as an organic EL layer ELYB, and the organic EL layer provided on each pixel PXG is referred to as an organic EL layer ELYG. When it is not necessary to distinguish the organic EL layer ELYR, the organic EL layer ELYG and the organic EL layer ELYB from each other, they are simply referred to as organic EL layers ELY.

A cathode CD is provided on the organic EL layer ELY. The cathode CD is formed from, for example, a magnesium-silver alloy (MgAg), a single layered film of silver (Ag) or a stacked layered film of silver (Ag) and a transparent conductive material. As the transparent conductive material, for example, indium tin oxide (ITO) or indium zinc oxide (IZO) can be used.

An insulating layer SEY is provided to cover the cathode CD. The insulating layer SEY has a function of preventing moisture from entering the organic EL layer ELY from the outside. As the insulating layer SEY, a material having a high gas barrier property is preferable. As the insulating layer SEY, for example, a layer obtained by sandwiching an organic insulating layer between two inorganic insulating layers containing nitrogen, can be used. Examples of the material for the organic insulating layer are acrylic resin, epoxy resin and polyimide resin. Examples of the material for the inorganic insulating layer containing nitrogen are silicon nitride and aluminum nitride.

A base BA2 is provided on the insulating layer SEY. The base BA2 is formed of a material similar to that of the base BA1. Between the base BA2 and the insulating layer SEY, a translucent inorganic insulating layer or a translucent organic insulating layer may as well be provided. The organic insulating layer may as well have the function of adhering the insulating layer SEY and the base BA2 together.

The light emission generated in the organic EL layer ELY is extracted upward via the cathode CD. In other words, the display device DSP of this embodiment has a top emission structure.

FIG. 4 is a cross-sectional view schematically showing a configuration example of the embodiment. In the display device DSP shown in FIG. 4, only the configuration in the vicinity of the organic EL layer ELY is shown. In FIG. 4, the anodes AD (anode ADR, anode ADG and anode ADB) are provided on the backplane BPS.

On the anodes AD, the organic EL layers ELY are provided, respectively. On the anode ADR, the organic EL layer ELYR is provided. On the anode ADB, the organic EL layer ELYB is provided. On the anode ADG, the organic EL layer ELYG is provided.

On the organic EL layer ELYR, an upper layer AOUR is provided. On the upper layer AOUR, an upper layer SNUR is provided. A side wall AOSR1, a side wall SNSR1, a side wall AOSR2, a side wall SNSR2, a side wall AOSR3, and a side wall SNSR3 are provided so as to cover side surfaces of the anode ADR, the organic EL layer ELYR, the upper layer AOUR, and the upper layer SNUR. The side wall AOSR1, the side wall SNSR1, the side wall AOSR2, the side wall SNSR2, the side wall AOSR3, and the side wall SNSR3 are formed from an inner side to an outer side in this order. That is, of the side wall AOSR1, the side wall SNSR1, the side wall AOSR2, the side wall SNSR2, the side wall AOSR3, and the side wall SNSR3, the side wall AOSR1 is the closest to the organic EL layer ELYR and the side wall SNSR3 is the farthest from the organic EL layer ELYR.

On the organic EL layer ELYG, an upper layer AOUG is provided. An upper layer SNUG is provided on the upper layer AOUG. A side wall AOSG1, a side wall SNSG1, a side wall AOSG2 and a side wall SNSG2 are provided to cover side surfaces of the anode ADG, the organic EL layer ELYG, the upper layer AOUG and the upper layer SNUG. The side wall AOSG1, the side wall SNSG1, the side wall AOSG2, and the side wall SNSG2 are formed from an inner side to an outer side in this order. That is, of the side wall AOSG1, the side wall SNSG1, the side wall AOSG2, and the side wall SNSG2, the side wall AOSG1 is the closest to the organic EL layer ELYG and the side wall SNSG2 is the farthest from the organic EL layer ELYG.

An upper layer AOUB is provided on the organic EL layer ELYB. An upper layer SNUB is provided on the upper layer AOUB. A side wall AOSB1 and a side wall SNSB1 are provided to cover side surfaces of the anode ADB, the organic EL layer ELYB, the upper layer AOUB, and the upper layer SNUB. The side wall AOSB1 and the side wall SNSB1 are formed from the inner side to the outer side in this order. That is, the side wall AOSB1 is closer to the organic EL layer ELYB and the side wall SNSB1 is farther from the organic EL layer ELYG.

In the pixel PXR, the upper layer AOUR and the side wall AOSR1 are formed to be integrated as one body. The thus integrally formed layer is referred to as a sacrificial layer AOYR.

In the pixel PXG, the upper layer AOUG and the side wall AOSG1 are formed to be integrated as one body. The thus integrally formed layer is referred to as a sacrificial layer AOYG.

In the pixel PXB, the upper layer AOUB and the side wall AOSB1 are formed to be integrated as one body. The thus integrally formed layer is referred to as a sacrificial layer AOYB.

A protective layer AOL is provided to cover a stacked body SKTR of the anode ADR, the organic EL layer ELYR, the upper layer AOUR, the upper layer SNUR, the side wall AOSR1, the side wall SNSR1, the side wall AOSR2, the side wall SNSR2, the side wall AOSR3, and the side wall SNSR3.

The protective layer AOL further covers the stacked body SKTG of the anode ADG, the organic EL layer ELYG, the upper layer AOUG, the upper layer SNUG, the side wall AOSG1, the side wall SNSG1, the side wall AOSG2, and the side wall SNSG2.

Furthermore, the protective layer AOL covers the stacked body SKTB of the anode ADB, the organic EL layer ELYB, the upper layer AOUB, the upper layer SNUB, the side wall AOSB1, and the side wall SNSB1.

The banks BK are each provided on the protective layer AOL and between each adjacent pair of organic EL layers ELY. A cathode CD is provided to cover the banks BK, the stacked body SKTR, the stacked body SKTG, the stacked body SKTB, and the protective layer AOL.

An insulating layer INS and an insulating layer PCL are formed to cover the cathode CD. On the insulating layer PCL, a base BA2 is provided.

In the pixel PXR, the upper layer AOUR, the side wall AOSR1, the side wall AOSR2, and the side wall AOSR3 are formed of aluminum oxide (AlOx), for example. The upper layer SNUR, the side wall SNSR1, the side wall SNSR2, and the side wall SNSR3 are formed of silicon nitride (SiN), for example.

In the pixel PXG, the upper layer AOUG, the side wall AOSG1, and the side wall AOSG2 are formed of, for example, aluminum oxide (AlOx). The upper layer SNUG, the side wall SNSG1, and the side wall SNSG2 are formed of silicon nitride (SiN), for example.

In the pixel PXB, the upper layer AOUB and the side wall AOSB1 are formed of, for example, aluminum oxide (AlOx). The upper layer SNUB and the side wall SNSB1 are formed of silicon nitride (SiN), for example.

The protective layer AOL is formed of, for example, aluminum oxide (AlOx). The materials of the insulating layer INS, the insulating layer PCL, and the base material BA2 will be described later.

Figure 5:
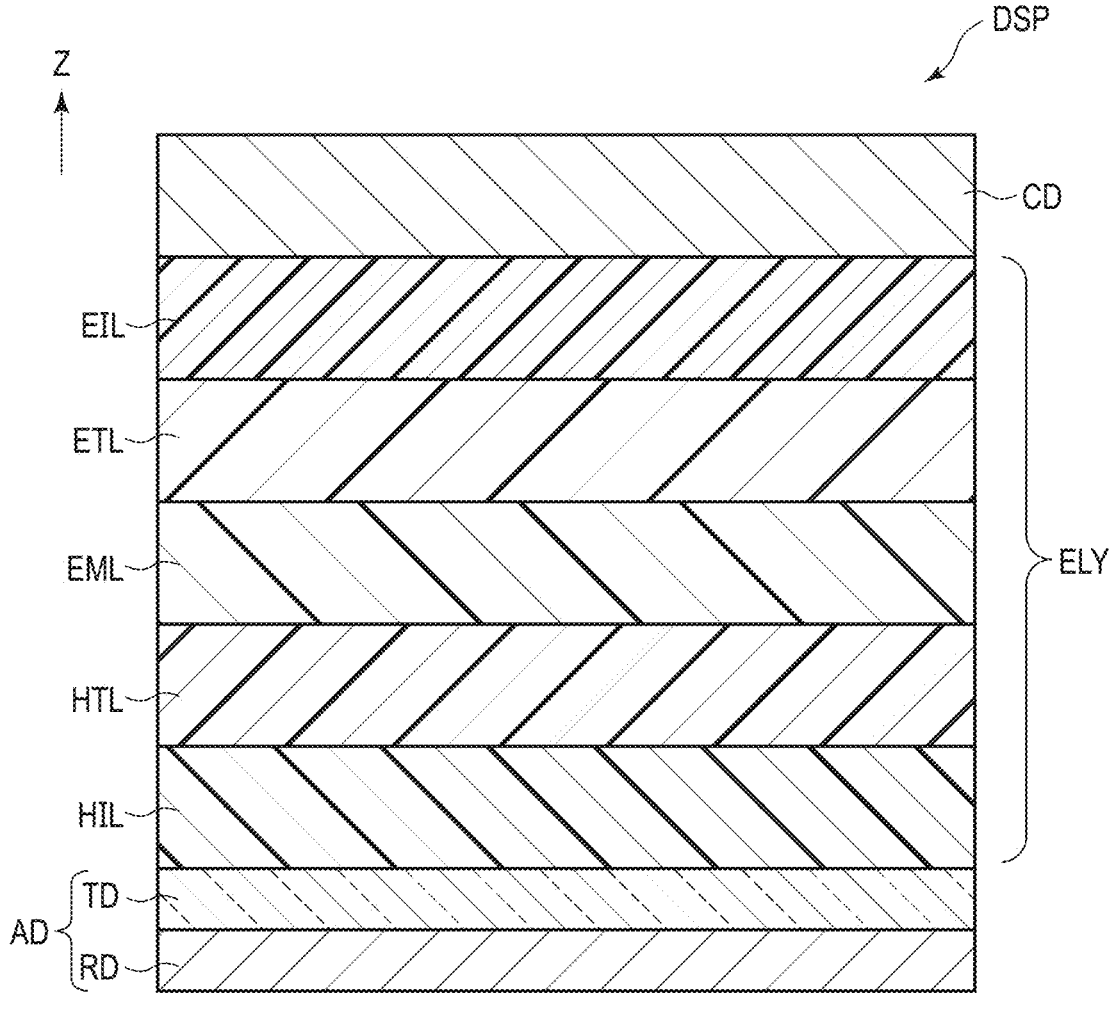
FIG. 5 is a cross-sectional view schematically showing a configuration example of Embodiment 1.

FIG. 5 is a cross-sectional view schematically showing a configuration example of Embodiment 1. FIG. 5 is a partially enlarged view of the illustration of FIG. 4. As shown in FIG. 5, between the anode AD and the cathode CD, the organic EL layer ELY is provided along the third direction Z. The organic EL layer ELY includes a hole injection layer HIL, a hole transport layer HTL, a light emitting layer EML, an electron transport layer ETL and an electron injection layer EIL, which are stacked one on another along the third direction Z.

Note that in the display device DSP of this embodiment, the anode AD, the organic EL layer ELY and the cathode CD are stacked along the third direction Z in this order. In the organic EL layer ELY, the hole injection layer HIL, the hole transport layer HTL, the light emitting layer EML, the electron transport layer ETL and the electron injection layer EIL are stacked along the third direction Z. Note that this embodiment is not limited to this configuration described above. In this embodiment of the display device DSP, they may as well be stacked in the order of the cathode CD, the organic EL layer ELY and the anode AD. Further, in the organic EL layer ELY, they may as well be stacked in the order of the electron injection layer EIL, the electron transport layer ETL, the light emitting layer EML, the hole transport layer HTL and the hole injection layer HIL.

Although not shown in FIG. 5, a light extraction layer and a sealing layer may as well be provided on the cathode CD. For example, the insulating layer SEY shown in FIG. 3 functions as a sealing layer.

FIGS. 6 to 23 each are a cross-sectional view showing a processing step of a method of manufacturing the display device of the embodiment. In FIGS. 6 to 23, the first pixel, which is one of the pixel PXR, pixel PXG and pixel PXB, is designated as a pixel PX1, and the second pixel, which is another one, is designated as a pixel PX2. In FIGS. 6 to 23, the pixels are formed in the order of the first pixel (pixel PX1) and the second pixel (pixel PX2). The third pixel (pixel PX3), which is the other one of the pixel PXR, pixel PXG and pixel PXB, is formed in a manner similar to that of the first pixel and the second pixel, though not shown in the drawing.

Figure 6:
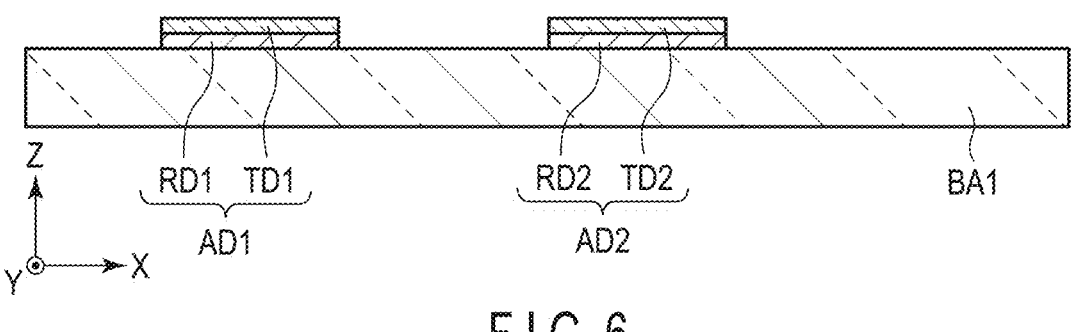
FIG. 6 is a cross-sectional view showing a step in a method of manufacturing the display device of Embodiment.

First, an anode AD1 and an anode AD2 are formed on a base BA1 (see FIG. 6). The anode AD1 is the anode of the pixel PX1, and the anode AD2 is the anode of the pixel PX2. The anode AD1 includes a reflective electrode RD1 and a transparent electrode TD1. The anode AD2 includes a reflective electrode RD2 and a transparent electrode TD2.

Figure 7:
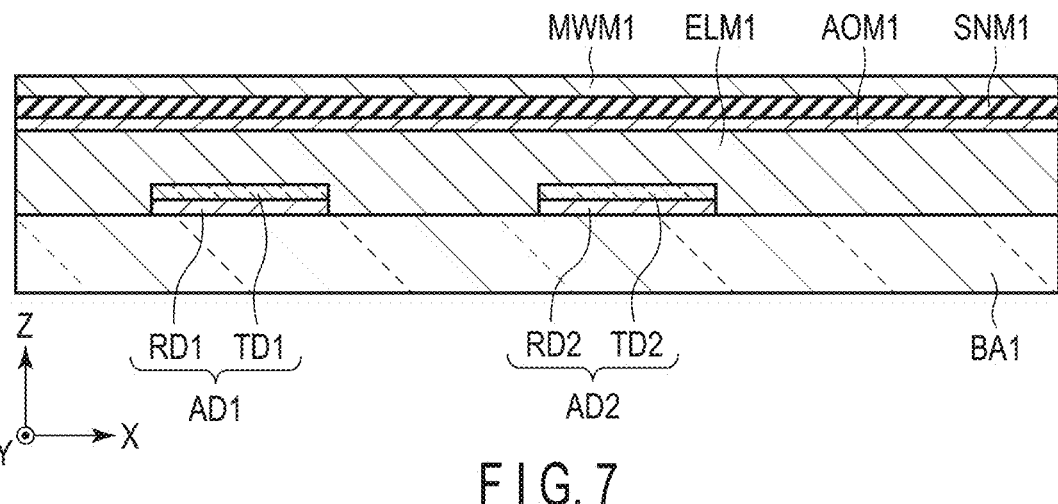
FIG. 7 is a cross-sectional view showing a further step in the method of manufacturing the display device of Embodiment 1.

An organic EL layer ELM1, a sacrificial layer AOM1, a protective layer SNM1 and a sacrificial layer MWM1 are formed to cover the base BA1, the anode AD1 and the anode AD2 (see FIG. 7). The organic EL layer ELM1 is the organic EL layer corresponding to the pixel PX1. It should be assumed here that the organic EL layer ELM1 includes the hole injection layer HIL, the hole transport layer HTL, the light emitting layer EML and the electron transport layer ETL, among the hole injection layer HIL, the hole transport layer HTL, the light emitting layer EML, the electron transport layer ETL and the electron injection layer EIL shown in FIG. 5.

The sacrificial layer AOM1 is formed, for example, of aluminum oxide (AlOx). The aluminum oxide layer can be formed by the atomic layer deposition (ALD) method.

The protective layer SNM1 is formed, for example, of silicon nitride (SiN). The silicon nitride layer can be formed by by low-temperature chemical vapor deposition (CVD).

The sacrificial layer MWM1 is formed, for example, of molybdenum-tungsten (MoW). The molybdenum-tungsten layer can be formed by the sputtering method.

Figure 8:
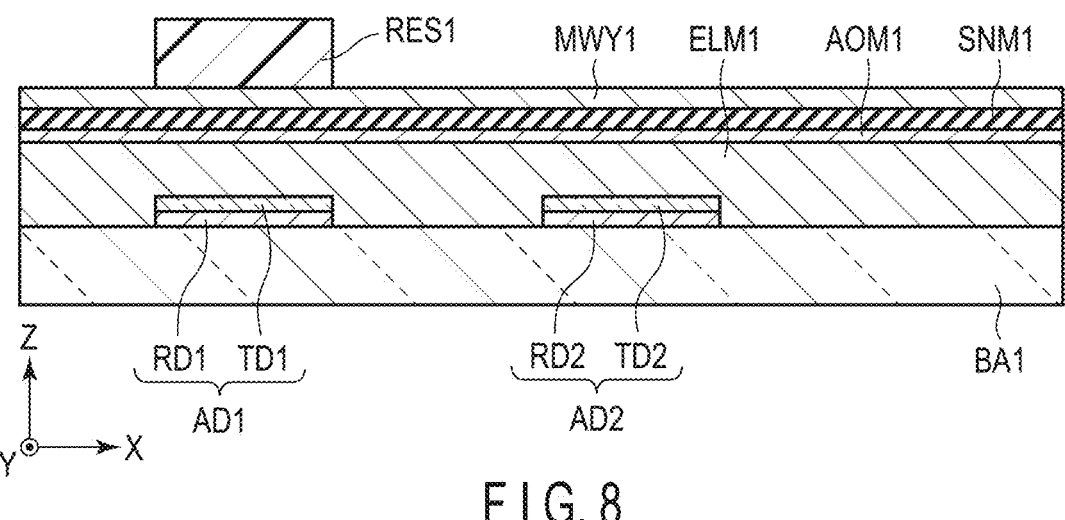
FIG. 8 is a cross-sectional view showing a further step in the method of manufacturing the display device of Embodiment 1.

A resist mask RES1 is formed on the sacrificial layer MWM1 so as to oppose the anode AD1 (see FIG. 8). No resist mask is formed on the anode AD2.

Using the resist mask RES1, the sacrificial layer MWM1 is partially removed by etching. As a result, the sacrificial layer MWY1 is formed into an island shape, so as to oppose the anode AD1 and sandwich the organic EL layer ELM1, the sacrificial layer AOM1 and the protective layer SNM1 (see FIG. 9).

Using the island-shaped sacrificial layer MWY1 as a mask, the organic EL layer ELM1, the sacrificial layer AOM1, and the protective layer SNM1 are partially removed by etching. As a result, the organic EL layer ELY1, the upper layer AOU1, and the upper layer SNU1 are formed into an island shape between the anode AD1 and the sacrificial layer MWY1 (see FIG. 10). The organic EL layer ELM1, the sacrificial layer AOM1, and the protective layer SNM1 on the anode AD2 are removed.

Figure 11:
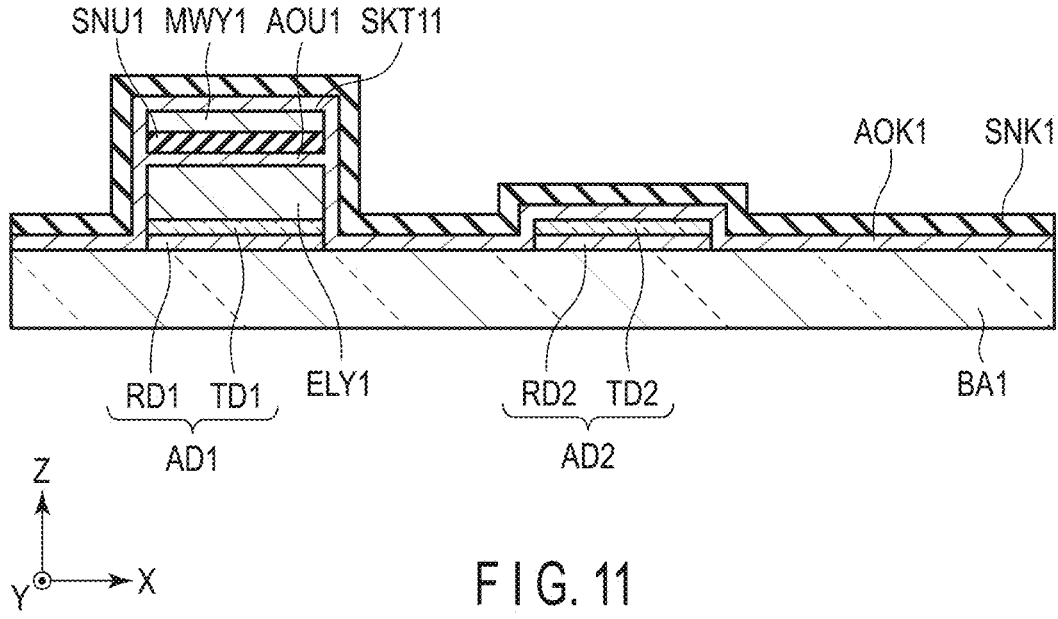
FIG. 11 is a cross-sectional view showing a further step in the method of manufacturing the display device of Embodiment 1.
Figure 12:
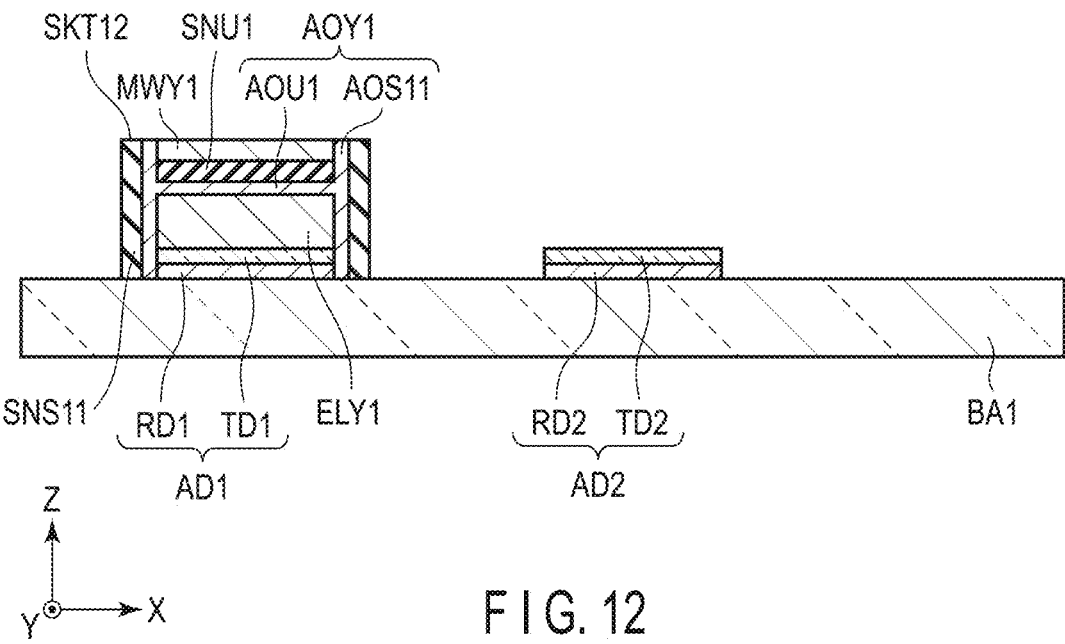
FIG. 12 is a cross-sectional view showing a further step in the method of manufacturing the display device of Embodiment 1.

A sacrificial layer AOK1 and a protective layer SNK1 are formed to cover the stacked body SKT11 of the anode AD1, the organic EL layer ELY1, the upper layer AOU1, the upper layer SNU1, and the sacrificial layer MWY1, and the anode AD2 (see FIG. 11). The sacrificial layer AOK1 is formed of the same material as that of the sacrificial layer AOM1. The protective layer SNK1 is formed of the same material as that of the protective layer SNM1. The upper layer AOU1 and the sacrificial layer AOK1 are integrated as one body.

The sacrificial layer AOK1 and the protective layer SNK1 are anisotropically etched so as to leave only the area in contact with the side surface of stacked body SKT11 and remove the other areas. Thus, a side wall AOS11 is formed from the sacrificial layer AOK1 and a side wall SNS11 is formed from the protective layer SNK1 (see FIG. 12). The upper layer AOU1 and the side wall AOS11 are integrated as one body and together form a sacrificial layer AOY1. The stacked body SKT11, the side wall AOS11, and the side wall SNS11 are together referred to as a stacked body SKT12.

An organic EL layer ELM2, a sacrificial layer AOM2, a protective layer SNM2, and a sacrificial layer MWM2 are formed to cover the base BA1, the stacked body SKT12, and the anode AD2 (see FIG. 13). The organic EL layer ELM2 is an organic EL layer corresponding to the pixel PX2. Note here that, as in the case of the organic EL layer ELM1, the organic EL layer ELM2 is assumed to include a hole injection layer HIL, a hole transport layer HTL, a light emitting layer EML and an electron transport layer ETL of the hole injection layer HIL, hole transport layer HTL, light emitting layer EML, electron transport layer ETL and electron injection layer EIL shown in FIG. 5. The sacrificial layer AOM2 and the protective layer SNM2 are the same materials as those of the sacrificial layer AOM1 and the protective layer SNM1, respectively.

A resist mask RES2 is formed on the sacrificial layer MWM2, so as to oppose the anode AD2. Using the resist mask RES2, the sacrificial layer MWM2 is partially removed by etching. As a result, a sacrificial layer MWY2 is formed into an island shape so as to oppose the anode AD2 and sandwich the organic EL layer ELM2, the protective layer SNM2, and the sacrificial layer AOM2 therebetween (see FIG. 14).

Next, the resist mask RES2 on the sacrificial layer MWY2 is removed (see FIG. 15).

Using the island-shaped sacrificial layer MWY2 as a mask, the organic EL layer ELM2, the protective layer SNM2, and the sacrificial layer AOM2 are partially removed by etching. As a result, the organic EL layer ELY2, the upper layer AOU2, and the upper layer SNU2 are formed into an island shape between the anode AD2 and the sacrificial layer MWY2 (see FIG. 16). The anode AD2, the organic EL layer ELY2, the upper layer AOU2, the upper layer SNU2, and the sacrificial layer MWY2 together form a stacked body SKT21.

A sacrificial layer AOK2 and a protective layer SNK2 are formed to cover the stacked body SKT12 and the stacked body SKT21 (see FIG. 17). The sacrificial layer AOK2 is formed of the same material as that of the sacrificial layer AOM1. The protective layer SNK2 is formed of the same material as that of the protective layer SNM1.

The sacrificial layer AOK2 and the protective layer SNK1 are anisotropically etched so as to leave only the area in contact with the side surface of the stacked body SKT12 and the side surface of stacked body SKT21, and to remove the other areas. As a result, a side wall AOS12 is formed from the sacrificial layer AOK2 and a side wall SNS12 is formed from the protective layer SNK2. On the side surface of the stacked body SKT21, a side wall AOS21 is formed from the sacrificial layer AOK2 and a side wall SNS21 is formed from the protective layer SNK2 (see FIG. 18).

The stacked body SKT12, the side wall AOS12, and the side wall SNS12 together form a stacked body SKT13. The upper layer AOU2 and the side wall AOS21 are integrated as one body and together form a sacrificial layer AOY2. The stacked body SKT21, the side wall AOS21, and the side wall SNS21 are together referred to as a stacked body SKT22.

The sacrificial layer MWY1 of the stacked body SKT13 and the sacrificial layer MWY2 of the stacked body SKT22 are removed by etching. In this process, upper portions of the side wall AOS11, the side wall SNS11, the side wall AOS12, and the side wall SNS21 are etched at the same time. Similarly, upper portions of the side wall AOS21 and the side wall SNS11 are etched at the same time. As a result, the stacked body SKT14 and the stacked body SKT23 whose upper surfaces are planarized are obtained from the stacked body SKT13 and the stacked body SKT22, respectively (see FIG. 19).

The protective layer AOL is formed to cover the stacked body SKT13 and the stacked body SKT22. The protective layer AOL is formed of the same material as that of the sacrificial layer AOM1 and the sacrificial layer AOM2 (see FIG. 20).

The banks BK are each formed between the stacked body SKT13 and the stacked body SKT22, in other words, between the organic EL layer ELY1 and the organic EL layer ELY2, so as to be in contact with the protective layer AOL. The banks BK are not formed above each of the organic EL layer ELY1 and the organic EL layer ELY2. In other words, above the organic EL layer ELY1 and the organic EL layer ELY2, an aperture OP1 and an aperture OP2 are formed, respectively (see FIG. 21).

The upper layer AOU1, the upper layer SNU1, and the protective layer AOL in the aperture OP1 are removed by etching. Similarly, the upper layer AOU2, the upper layer SNU2, and the protective layer AOL in the aperture OP2 are removed by etching. As a result, the organic ELY1 layer and the organic ELY2 layer are exposed in the aperture OP1 and the aperture OP2 (see FIG. 22).

The cathode CD, the insulating layer INS, and the insulating layer PCL are formed to cover the exposed organic EL layer ELY1 and organic EL layer ELY2 and the banks BK. On the insulating layer PCL, a base BA2 is provided (see FIG. 23).

In the aperture OP1 and the aperture OP2, the cathode CD is provided on each of the organic EL layer ELY1 and the organic EL layer ELY2. Thus, the display device DSP of Embodiment 1 is formed.

The insulating layer INS is formed, for example, of silicon nitride (SiN). The insulating layer INS prevents moisture from entering the organic EL layer from the outside. The insulating layer PCL is formed, for example, of a resin insulating material. The insulating layer PCL has the function of planarizing the surface. For the base BA2, the same material as that of the base material BA1 can be used.

To form the anode and the organic EL layer of the pixel PX3, which is the third pixel, after the completion of the process shown in FIG. 18, an organic EL layer corresponding to the pixel PX3, a sacrificial layer of a material similar to that of the sacrificial layer AOM1, that is, for example, aluminum oxide (ALOx), a protective layer of a material similar to that of the protective layer SNM1, that is, for example, silicon nitride (SiN) can be formed as in the case shown in FIG. 13. Further, as in the case of FIG. 18, in the pixel PX3 as well, side walls can be formed from the sacrificial layer and the protective layer, respectively. After that, the step should proceed to the process shown in FIG. 19.

Along with the formation of the side walls of the pixel PX3, side walls are further formed in the pixel PX1 and the pixel PX2. In other words, in the pixel PX1, side walls (to be referred to as side walls AOS13, though not shown in the figure) are formed of a material similar to that of the sacrificial layer AOM1, so as to be in contact with the side walls SNS13, respectively. So as to be in contact with the side walls AOS13, side walls (to be referred to as side walls SNS13, though not shown) are formed of a material similar to that of the protective layer SNM1.

In the pixel PX2, side walls (to be referred to as side walls AOS22, though not shown in the figure) are formed of a material similar to that of the sacrificial layer AOM1, so as to be in contact with the side walls SNS13, respectively. So as to be in contact with the side walls AOS22, side walls (to be referred to as side walls SNS22, though not shown) are formed of a material similar to that of the protective layer SNM1.

In this embodiment, the pixel PX1, pixel PX2, and pixel PX3 should be a pixel PXR, a pixel PXG, and a pixel PXB, respectively.

In this embodiment, in the stacked body to be subjected to anisotropic etching, side walls of aluminum oxide (ALOx) and side walls of silicon nitride, for example, are formed on side surfaces of each of the organic EL layers ELY. Further, a layer of aluminum oxide (ALOx) and a layer of silicon nitride (SiN), for example, are formed on upper surfaces of the organic EL layers ELY. In this way, it is possible to protect the organic EL layers during anisotropic etching.

Figure 24:
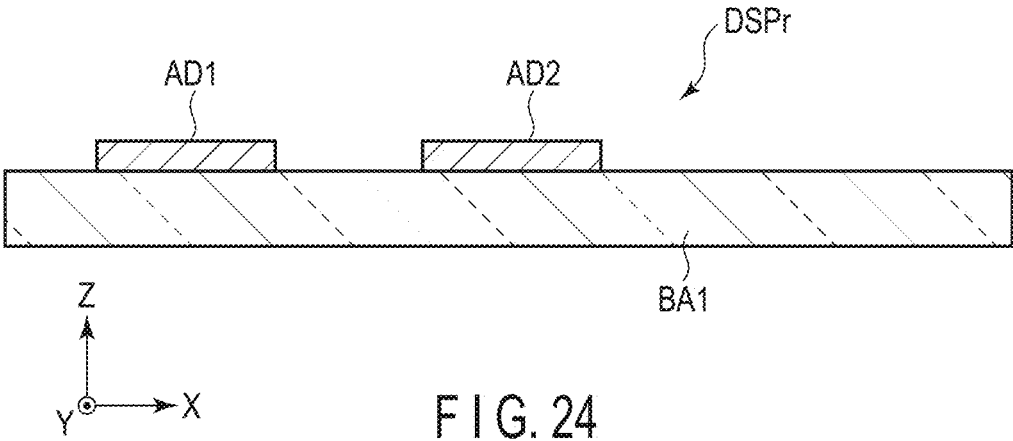
FIG. 24 is a cross-sectional view showing a step in a method of manufacturing a display device of comparative example 1.
Figure 25:
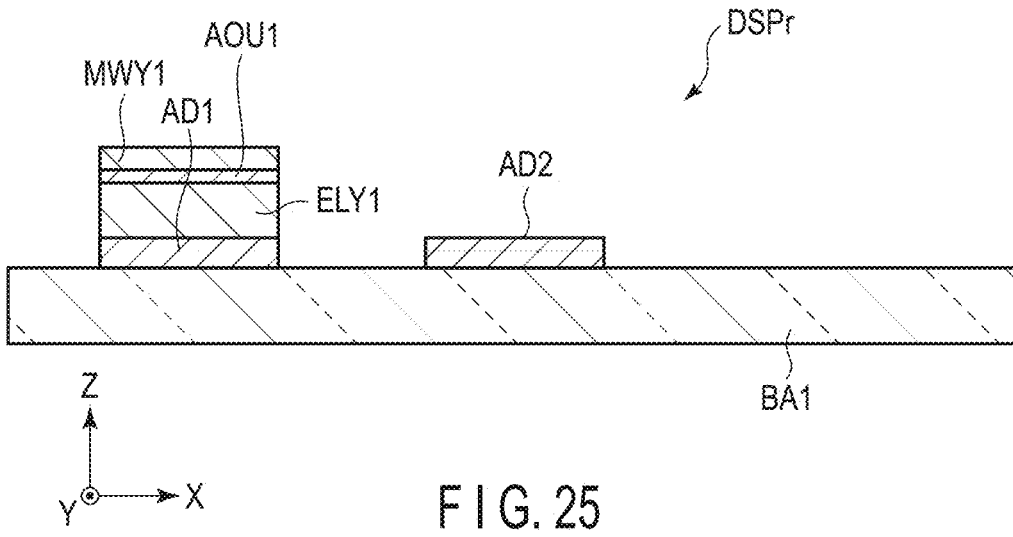
FIG. 25 is a cross-sectional view showing a further step in the method of manufacturing the display device of comparative example 1.
Figure 26:
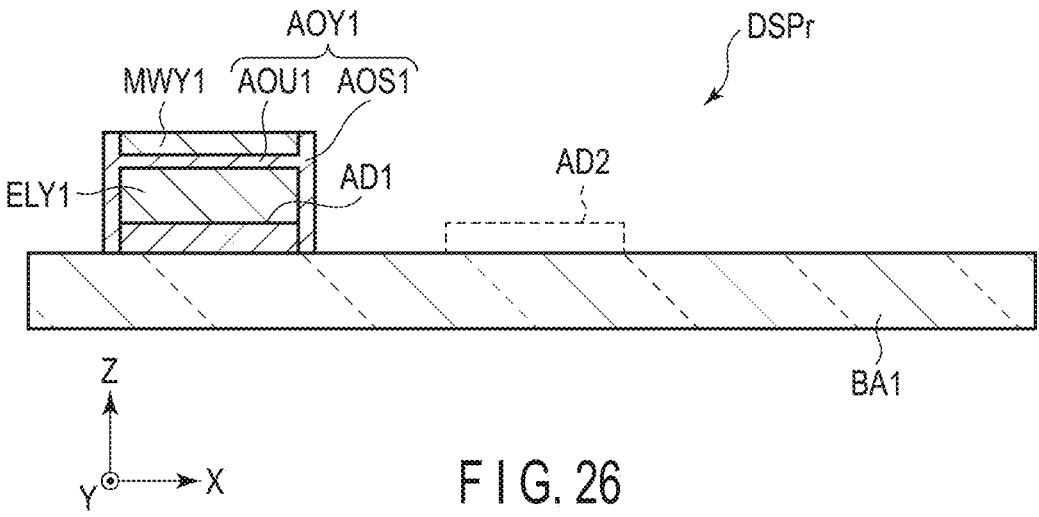
FIG. 26 is a cross-sectional view showing a further step in the method of manufacturing the display device of comparative example 1.

FIGS. 24 to 26 are cross-sectional views each showing a processing step in a method of manufacturing a display device in comparative example 1. In order to manufacture a display device DSPr in the comparative example 1, first, an anode AD1 and an anode AD2 are formed on the base BA1 (see FIG. 24). The anode AD1 and the anode AD2 in the comparative example are assumed to be transparent electrodes formed of metal oxides. Such metal oxides include indium tin oxide and indium zinc oxide described above. Note that the processing step shown in FIG. 24 corresponds to the step shown in FIG. 6.

Figure 9:
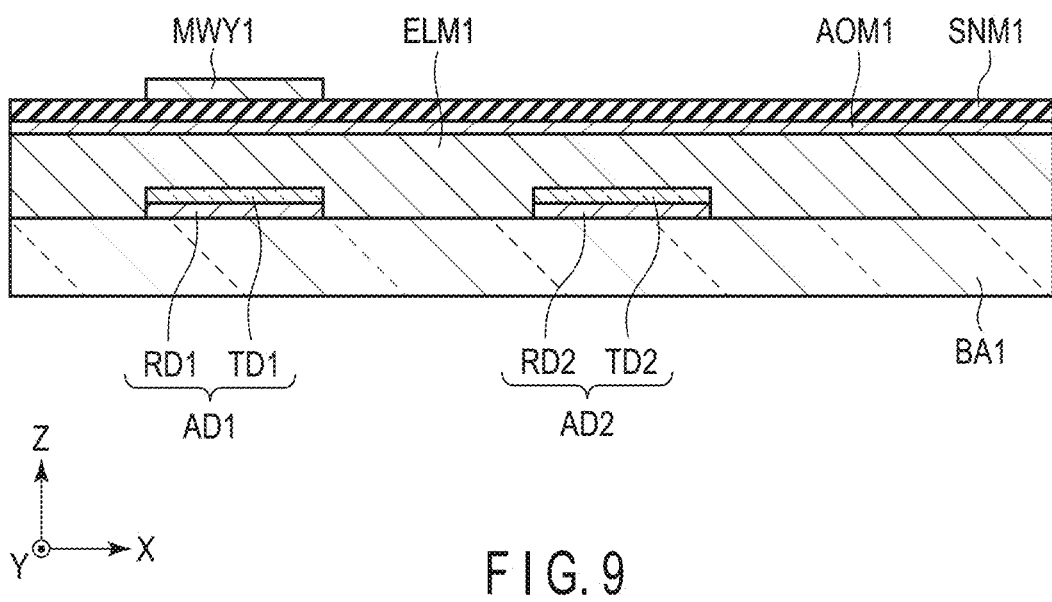
FIG. 9 is a cross-sectional view showing a further step in the method of manufacturing the display device of Embodiment 1.
Figure 10:
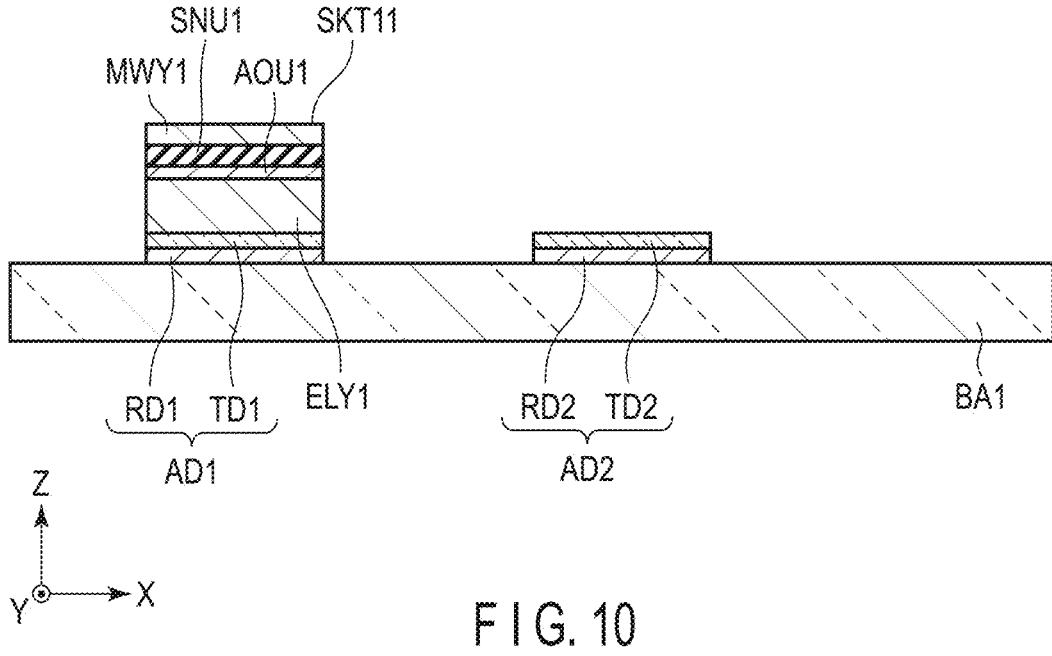
FIG. 10 is a cross-sectional view showing a further step in the method of manufacturing the display device of Embodiment 1.

Through the processing steps shown in FIGS. 7 to 9, an organic EL layer ELY1, an upper layer AOU1 of a sacrificial layer and a sacrificial layer MWY1 are formed on the anode AD1. On the anode AD2, the sacrificial layer is removed (see FIG. 25). The processing step shown in FIG. 25 corresponds to the step shown in FIG. 10.

Next, side walls AOS1 are formed so as to be in contact with side surfaces of each of the anode AD1, the organic EL layer ELY1, the upper layer AOU1 and the sacrificial layer MWY1. First, a material film which give rise to the side walls AOS1 is formed to cover the stacked body of the organic EL layer ELY1, the upper layer AOU1 and the sacrificial layer MWY1. Then, the material film is subjected to anisotropic etching to leave only the area in contact with the side surfaces of the stacked body and remove the other areas, and thus the side walls AOS1 are formed.

The material of the side walls AOS1 is the same as that of the sacrificial layer AOM1, which is, for example, aluminum oxide (AlOx). On the other hand, the anode AD1 and the anode AD2 are formed of metal oxide, for example, as described above.

That is, the side walls AOS1, as well as the anode AD1 and the anode AD2, are formed of a material containing a metal oxide. When etching such metal oxides, it is, in some cases, necessary to use an etching gas whose selectivity cannot be taken.

In this case, during the etching to form the side walls AOS1, the anode AD2 may as well be removed together (see FIG. 26). If the anode is removed, the pixel will not emit light properly. In such a display device, the display quality is deteriorated.

Figure 27:
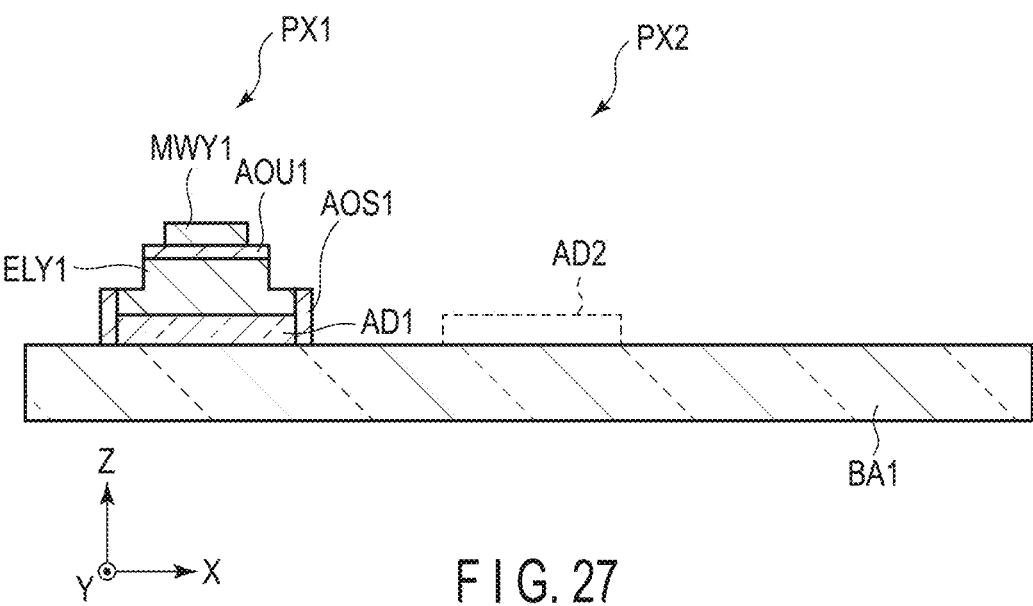
FIG. 27 is a cross-sectional view showing a step in a method of manufacturing a display device of comparative example 2.

FIG. 27 shows a cross-sectional view a processing step of a method of manufacturing a display device of comparative example 2. As in the case of comparative example 1, anisotropic etching is carried out in the manufacturing process shown in FIG. 25. In that process, a part of the sacrificial layer MWY1, a part of the side walls AOS1, and even a part of the organic EL layer ELY1 of the pixel PX1 may be etched undesirably. When a part of the organic EL layer ELY1 is etched, the light emitting area of the pixel PX1 will be reduced.

In this embodiment, the upper layer AOU (upper layer AOU1 and upper layer AOU2) and the upper layer SNU (upper layer SNU1 and upper layer SNU2) are provided on the organic EL layer ELY. On the side surfaces of the organic EL layer ELY, there are, for example, one or more aluminum oxide (AlOx) side walls (side wall AOS11, side wall AOS12, and side wall AOS21), and one or more silicon nitride (SiN) side walls (side wall SNS11, side wall SNS12, and side wall SNS21) provided. In other words, when one of the sidewalls of aluminum oxide and one of the sidewalls of silicon nitride are considered as one set of sidewalls, at least one or more sets of sidewalls are provided. With this configuration, the organic EL layer ELY is never etched and the light emitting area of the pixel PX is never reduced. Thus, the display quality of the display device DSP can be improved.

Embodiment 2

FIG. 28 is a cross-sectional view schematically showing a configuration example of a display device of Embodiment 2. A display device DSP shown in FIG. 28 is different from the display device DSP shown in FIG. 4 in that the pixel PXB is not provided with side walls.

In the display device DSP shown in FIG. 28, in the pixel PXB, an upper layer AOUB is provided on the organic EL layer ELYB. Side walls AOSB1 are each provided to cover a respective side surface of each of the anode ADB, the organic EL layer ELYB, and the upper layer AOUB. The upper layer AOUB and the side walls AOSB1 are integrated as one body and constitute a part of the protective layer AOL.

In the pixel PXR, an upper layer AOUR is provided on the organic EL layer ELYR. On the upper layer AOUR, an upper layer SNUR is provided. A side wall AOSR1, a side wall SNSR1, a side wall AOSR2, and a side wall SNSR2 are provided to cover respective side surfaces of the anode ADR, the organic EL layer ELYR, the upper layer AOUR, and the upper layer SNUR. The sidewall AOSR1, the sidewall SNSR1, the sidewall AOSR2, and the sidewall SNSR2 are formed from the inner side to the outer side in this order. In other words, of the sidewall AOSR1, the sidewall SNSR1, the sidewall AOSR2, and the sidewall SNSR2, the sidewall AOSR1 is closest to the organic EL layer ELYR and the sidewall SNSR2 is farthest from the organic EL layer ELYR.

In the pixel PXG, an upper layer AOUG is provided on the organic EL layer ELYG. An upper layer SNUG is provided on the upper layer AOUG. A side wall AOSG1 and a side wall SNSG1 are provided to cover respective side surfaces of the anode ADG, the organic EL layer ELYG, the upper layer AOUG, and the upper layer SNUG. The sidewall AOSG1 and the sidewall SNSG1 are formed from the inner side to the outer side in this order. In other words, the sidewall AOSG1 is closer to the organic EL layer ELYG and the sidewall SNSG2 is farther from the organic EL layer ELYG.

FIGS. 29 to 38 are each a cross-sectional view showing a respective step in the method of manufacturing the display device of Embodiment 2. In FIGS. 29 to 38, the pixel PX1, the pixel PX2, and the pixel PX3 correspond to the pixel PXR, the pixel PXG, and the pixel PXB shown in FIG. 28, respectively. Note that that the correspondence between the pixel PX1, the pixel PX2, and the pixel PX3, and the pixel PXR, the pixel PXG, and the pixel PXB is not limited to that of this embodiment.

Figure 19:
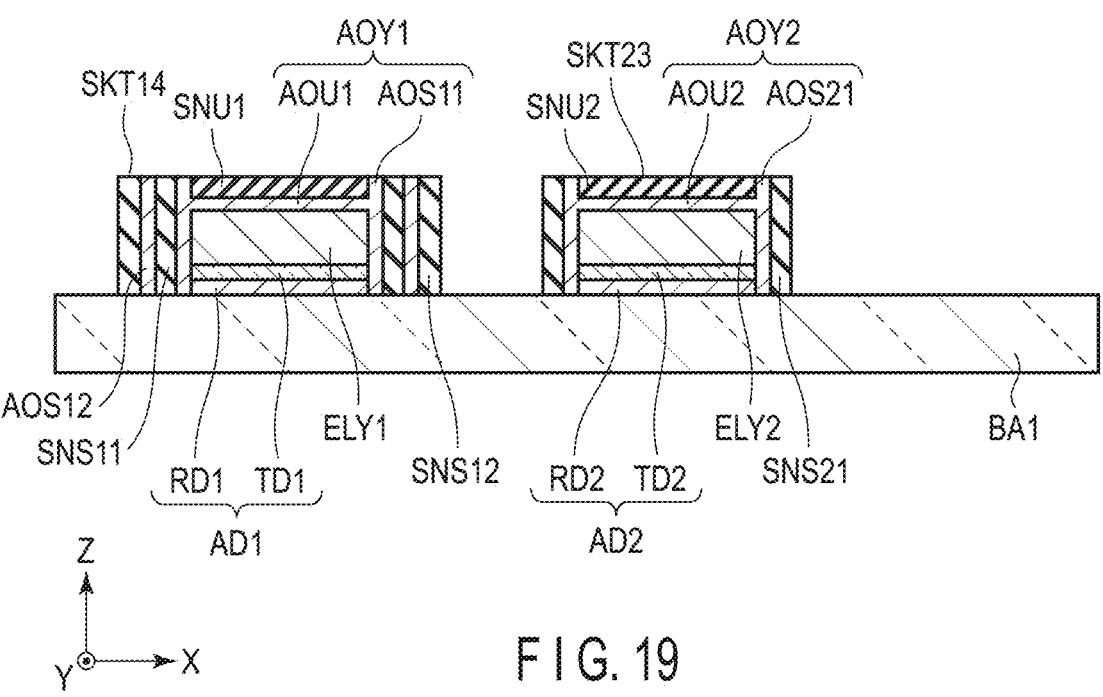
FIG. 19 is a cross-sectional view showing a further step in the method of manufacturing the display device of Embodiment 1.
Figure 20:
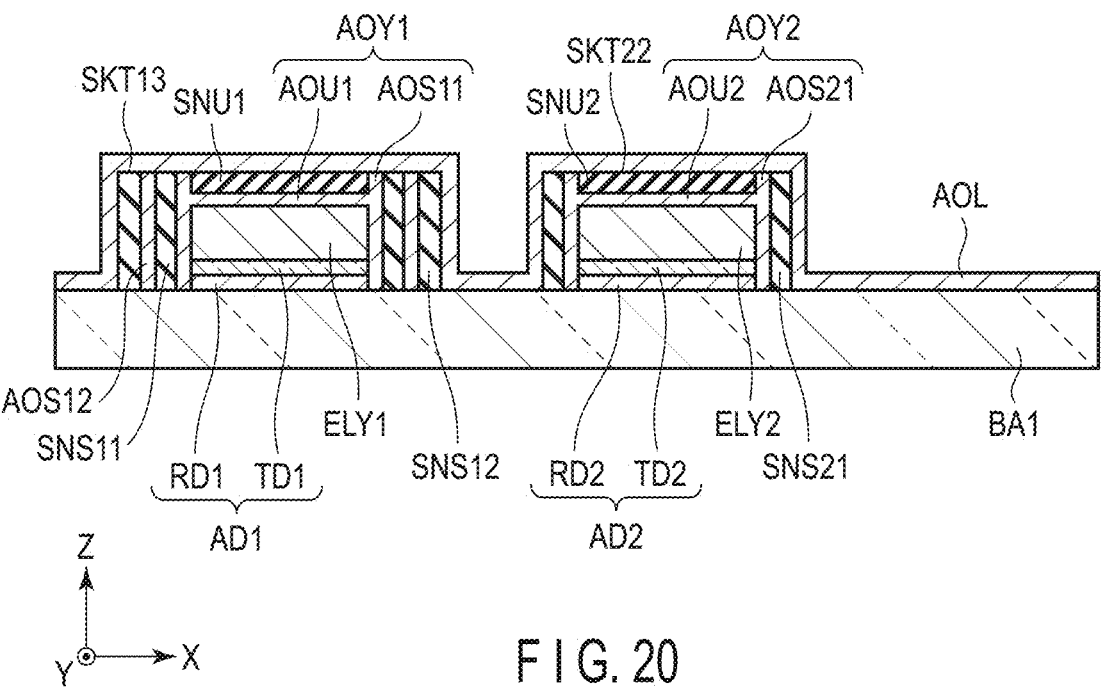
FIG. 20 is a cross-sectional view showing a further step in the method of manufacturing the display device of Embodiment 1.

The manufacturing process shown in FIGS. 6 to 16 is used up to the formation of the side wall SNS11 (see FIG. 29). The manufacturing process shown in FIGS. 17 to 19 is used up to the formation of the side wall SNS12 and the side wall SNS21 (see FIG. 30).

The organic EL layer ELM3, the sacrificial layer AOM3, and the sacrificial layer MWM3 are formed to cover the base BA1, the stacked body SKT14 of the pixel PX1, the stacked body SKT23 of the pixel PX2, and the anode AD3 of the pixel PX3 (see FIG. 31). The organic EL layer ELM3 is an organic EL layer corresponding to the pixel PX3. The sacrificial layer AOM3 and the sacrificial layer MWM3 are formed of materials the same as those of the sacrificial layer AOM1 and the sacrificial layer MWM1, respectively.

Using a resist mask, the sacrificial layer MWM3 is partially removed by etching. As a result, the sacrificial layer MWY3 is formed into an island shape which oppose the anode AD3 and sandwich the organic EL layer ELM3 and the sacrificial layer AOM3 therebetween (see FIG. 32).

Using the island-shaped sacrificial layer MWY3 as a mask, the organic EL layer ELM3 and the sacrificial layer AOM3 are partially removed by etching. As a result, the organic EL layer ELY3 and the upper layer AOU3 are formed into an island shape between the anode AD3 and the sacrificial layer MWY3 (see FIG. 33). The stacked body of the anode AD3, the organic EL layer ELY3, and the sacrificial layer MWY3 is referred to as a stacked body SKT31.

The sacrificial layer AOK1 is formed to cover the stacked body SKT14, the stacked body SKT23, and the stacked body SKT31 (see FIG. 34). The sacrificial layer AOK3 is formed of the same material as that of the sacrificial layer AOM1. The upper layer AOU3 and the sacrificial layer AOK3 are integrated as one body.

The sacrificial layer AOK3 is anisotropically etched so as to leave only the area in contact with the side surface of the stacked body SKT31 and remove the other areas. With this configuration, the side wall AOS3 is formed from the sacrificial layer AOK1 (see FIG. 35). The upper layer AOU3 and the side wall AOS31 are integrated as one body and together form the sacrificial layer AOY3. The stacked body SKT31 and the side wall AOS31 are together referred to as a stacked body SKT32.

As in the case of FIG. 19, the sacrificial layer MWY1 of the stacked body SKT15, the sacrificial layer MWY2 of the stacked body SKT24, and the sacrificial layer MWY3 of the stacked body SKT32 are removed by etching. In this process, an upper portion of each of the side wall AOS11, the side wall SNS11, the side wall AOS12, the side wall SNS12, the side wall AOS21, the side wall SNS21, and the side wall AOS31 are etched at the same time. In this manner, the stacked body SKT16, the stacked body SKT25, and the stacked body SKT33 whose upper surface are planarized are obtained from the stacked body SKT15, the stacked body SKT24, and the stacked body SKT32, respectively (see FIG. 36)

A protective layer AOL is formed to cover the stacked body SKT16, the stacked body SKT25, and the stacked body SKT33. The protective layer AOL is formed of the same material as that of the sacrificial layer AOM1, the sacrificial layer AOM2, and the sacrificial layer AOM3 (see FIG. 37). The upper layer AOM3 and the protective layer AOL are integrated as one body and the thickness of the upper layer AOM3 is increased.

The banks BK are each formed between the stacked body SKT16, the stacked body SKT25, and the stacked body SKT33, in other words, between the organic EL layer ELY1, the organic EL layer ELY2, and the organic EL layer ELY3, so as to be in contact with the protective layer AOL. The banks BK are not formed above the organic EL layer ELY1, the organic EL layer ELY2, and the organic EL layer ELY3. In other words, an aperture OP1, an aperture OP2, and an aperture OP3 are provided above the organic EL layer ELY1, the organic EL layer ELY2, and the organic EL layer ELY3, respectively.

The upper layer AOU1, the upper layer SNU1, and the protective layer AOL in the aperture OP1, the upper layer AOU2, the upper layer SNU2, and the protective layer AOL in the aperture OP2, and the upper layer AOU3 in the aperture OP3 are removed by etching. With this configuration, the organic EL layer ELY1, the organic EL layer ELY2, and the organic EL layer ELY3 are exposed in the aperture OP1, the aperture OP2, and the aperture OP3 (see FIG. 38).

Figure 23:
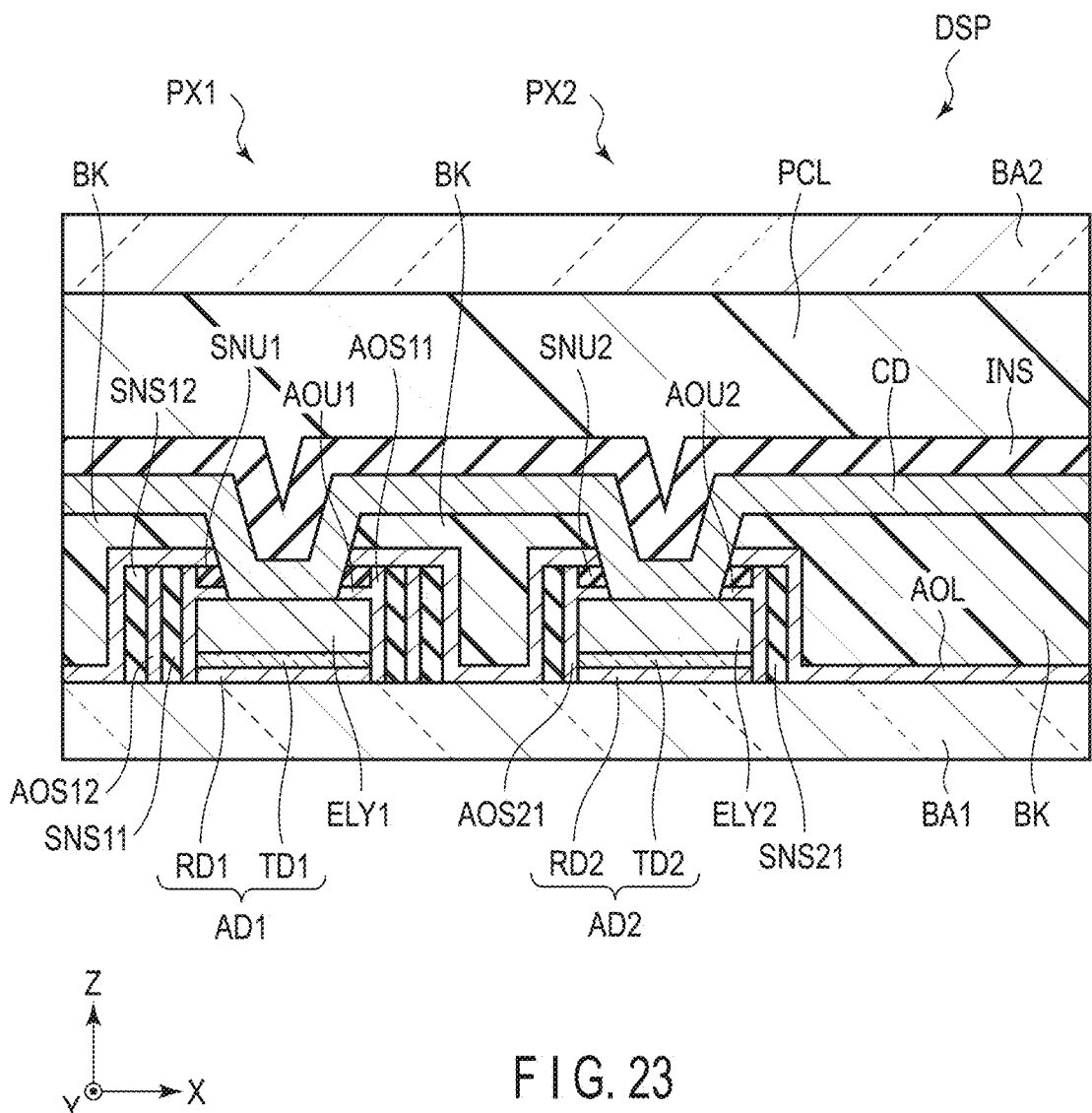
FIG. 23 is a cross-sectional view showing a further step in the method of manufacturing the display device of Embodiment 1.

As in the case of FIG. 23, the cathode CD, the insulating layer INS, and the insulating layer PCL are formed to cover the exposed organic EL layer ELY1, organic EL layer ELY2, and organic EL layer ELY3, and the banks BK. On the insulating layer PCL, the base BA2 is provided. As described above, the display device DSP of Embodiment 2 is formed.

In Embodiment 2, the only side wall of the pixel PX3 is the side wall AOS31. With this configuration, it is possible to increase the design margin in the manufacturing process of the display device DSP of Embodiment 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a plurality of pixels including a first pixel, a second pixel and a third pixel; and
a bank provided between each respective adjacent pair of the pixels,
each of the plurality of pixels comprising, on a base:
an anode;
an organic EL layer provided on the anode;
at least one set of sidewall pairs provided to cover a side surface of the organic EL layer; and
a cathode provided in an opening portion of the bank and in contact with the organic EL layer, and
the at least one set of side wall pairs comprising:
a first sidewall formed of aluminum oxide; and
a second sidewall formed of silicon nitride, and
the first pixel including at least two sets of the side wall pairs, and
the second pixel including at least one set of the sidewall pair.

2. The display device according to claim 1, wherein the first pixel includes three sets of the sidewall pairs, the second pixel includes two sets of the sidewall pairs, and
the third pixel includes one set of the sidewall pair.

3. The display device according to claim 1, wherein the first pixel includes two sets of the sidewall pairs, the second pixel includes one set of the sidewall pair; and the third pixel includes a side wall formed of aluminum oxide.

4. The display device according to claim 1, further comprising:
an upper layer formed of aluminum oxide on the organic EL layer.

* * * * *